US 7,768,308 B2

(12) United States Patent
Maede et al.

(10) Patent No.: US 7,768,308 B2
(45) Date of Patent: Aug. 3, 2010

(54) LEVEL SHIFT CIRCUIT

(75) Inventors: Masato Maede, Takatsuki (JP); Naoki Nojiri, Osaka (JP); Masahiro Gion, Muko (JP); Shinji Kinuyama, Takatsuki (JP); Daisuke Matsuoka, Takatsuki (JP); Shiro Usami, Kyoto (JP)

(73) Assignee: Panasonic Corporation, Osaka (JP)

( * ) Notice: Subject to any disclaimer, the term of this patent is extended or adjusted under 35 U.S.C. 154(b) by 57 days.

(21) Appl. No.: 12/133,124

(22) Filed: Jun. 4, 2008

(65) Prior Publication Data
US 2008/0238481 A1      Oct. 2, 2008

Related U.S. Application Data

(62) Division of application No. 11/808,814, filed on Jun. 13, 2007, now abandoned, which is a division of application No. 11/002,625, filed on Dec. 3, 2004, now abandoned.

(30) Foreign Application Priority Data

Dec. 18, 2003 (JP) ............................. 2003-421155
Nov. 15, 2004 (JP) ............................. 2004-330249

(51) Int. Cl.
*H03K 19/094* (2006.01)
(52) U.S. Cl. ........................................ 326/68; 327/333
(58) Field of Classification Search ................ 326/68, 326/81; 327/112, 333
See application file for complete search history.

(56) References Cited

U.S. PATENT DOCUMENTS 4,450,371 A    5/1984  Bismarck 4,486,670 A    12/1984  Chan et al.
4,532,436 A    7/1985   Bismarck (Continued)

FOREIGN PATENT DOCUMENTS

JP          04-040798        7/1992

(Continued)

OTHER PUBLICATIONS

Japanese Office Action, with English translation, issued in Japanese Patent Application No. 2004-335785, mailed Feb. 23, 2010.

*Primary Examiner*—Vibol Tan
*Assistant Examiner*—Crystal L Hammond
(74) *Attorney, Agent, or Firm*—McDermott Will & Emery LLP

(57) ABSTRACT

In a level shift circuit, the threshold voltage of N-type high-voltage transistors, to whose gates the voltage of a low-voltage supply VDD is applied, is set low. An input signal IN powered by the low-voltage supply VDD is input to the gate of an N-type transistor by way of an inverter. Therefore, even if the potentials at nodes W3 and W4 exceed the voltage of the low-voltage supply VDD, reverse current flow from the nodes W3 and W4 via parasitic diodes within the inverters into the low-voltage supply VDD is prevented. A protection circuit, composed of N-type transistor whose respective gates are fixed to the low-voltage supply VDD, is disposed between the two N-type high-voltage transistors N5, N6 and two N-type low-voltage transistors N1, N2 for receiving the complementary signals IN and XIN, thereby preventing the breakdown of those N-type complementary-signal-receiving transistors.

14 Claims, 23 Drawing Sheets

U.S. PATENT DOCUMENTS

| | | |
|---|---|---|
| 4,980,583 A | 12/1990 | Dietz |
| 5,539,334 A | 7/1996 | Clapp et al. |
| 5,559,464 A * | 9/1996 | Orii et al. .................. 327/333 |
| 5,736,869 A | 4/1998 | Wei |
| 5,821,800 A * | 10/1998 | Le et al. ..................... 327/333 |
| 5,896,043 A * | 4/1999 | Kumagai ..................... 326/68 |
| 5,969,542 A * | 10/1999 | Maley et al. .................. 326/81 |
| 6,064,227 A * | 5/2000 | Saito ........................... 326/68 |
| 6,351,173 B1 * | 2/2002 | Ovens et al. ................ 327/333 |
| 6,445,210 B2 | 9/2002 | Nojiri |
| 6,507,226 B2 | 1/2003 | Swonger et al. |
| 6,556,061 B1 | 4/2003 | Chen et al. |
| 6,642,769 B1 * | 11/2003 | Chang et al. ................ 327/333 |
| 6,650,168 B1 | 11/2003 | Wang et al. |
| 6,801,064 B1 * | 10/2004 | Hunt et al. .................. 327/112 |
| 6,995,598 B2 | 2/2006 | Hochschild |
| 7,068,074 B2 | 6/2006 | Bhattacharya et al. |
| 7,102,410 B2 | 9/2006 | Khan et al. |
| 7,151,400 B2 | 12/2006 | Chen |
| 2003/0132779 A1 | 7/2003 | Yoo et al. |

FOREIGN PATENT DOCUMENTS

| | | |
|---|---|---|
| JP | 10-041806 | 2/1998 |
| JP | 11-330942 | 11/1999 |
| JP | 2001-298356 A | 10/2001 |

\* cited by examiner

POWER SUPPLY CIRCUIT

POWER SUPPLY CIRCUIT

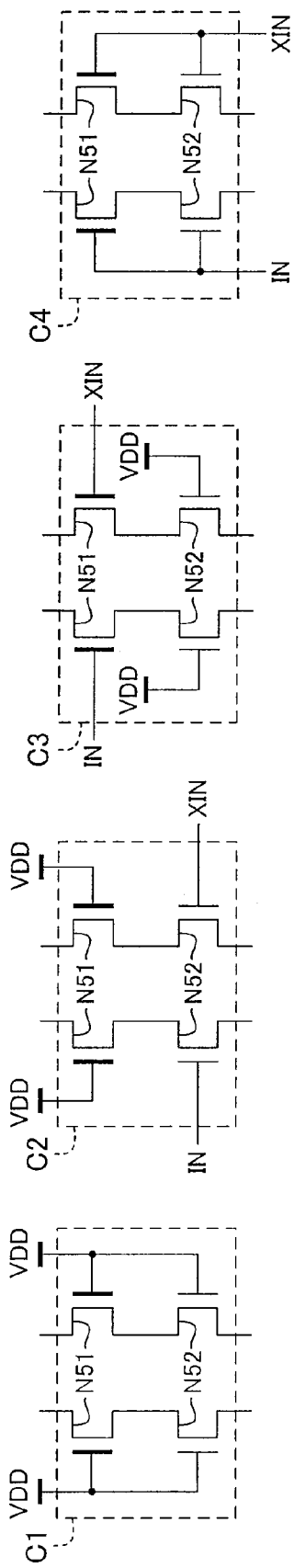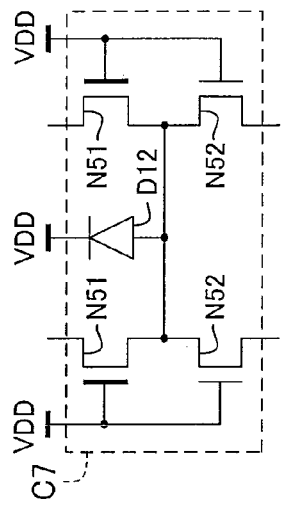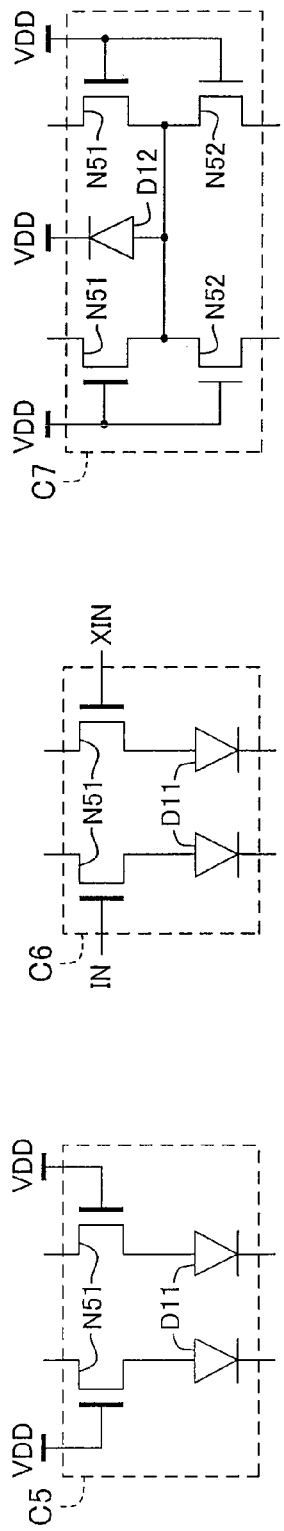

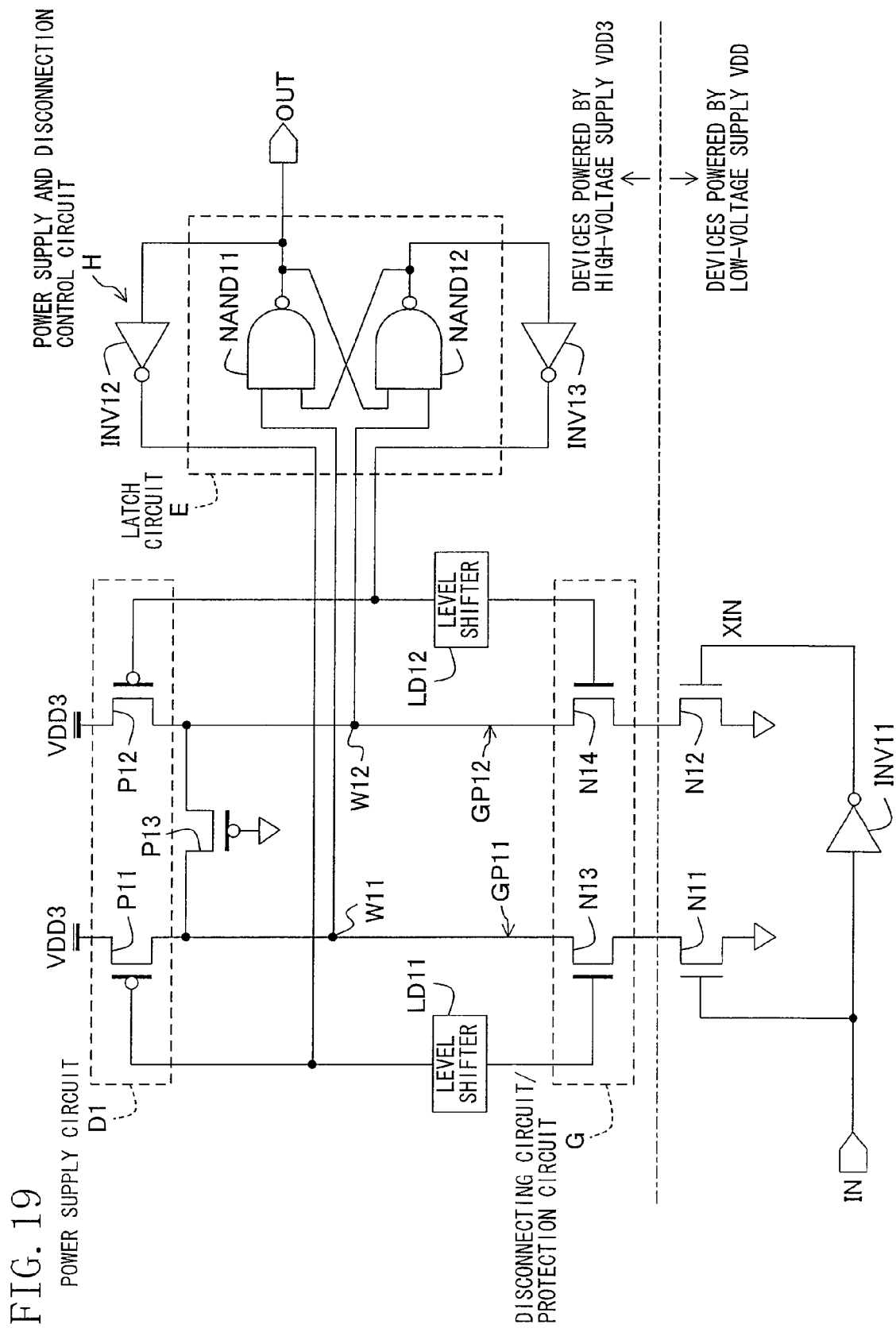
FIG. 19 POWER SUPPLY CIRCUIT

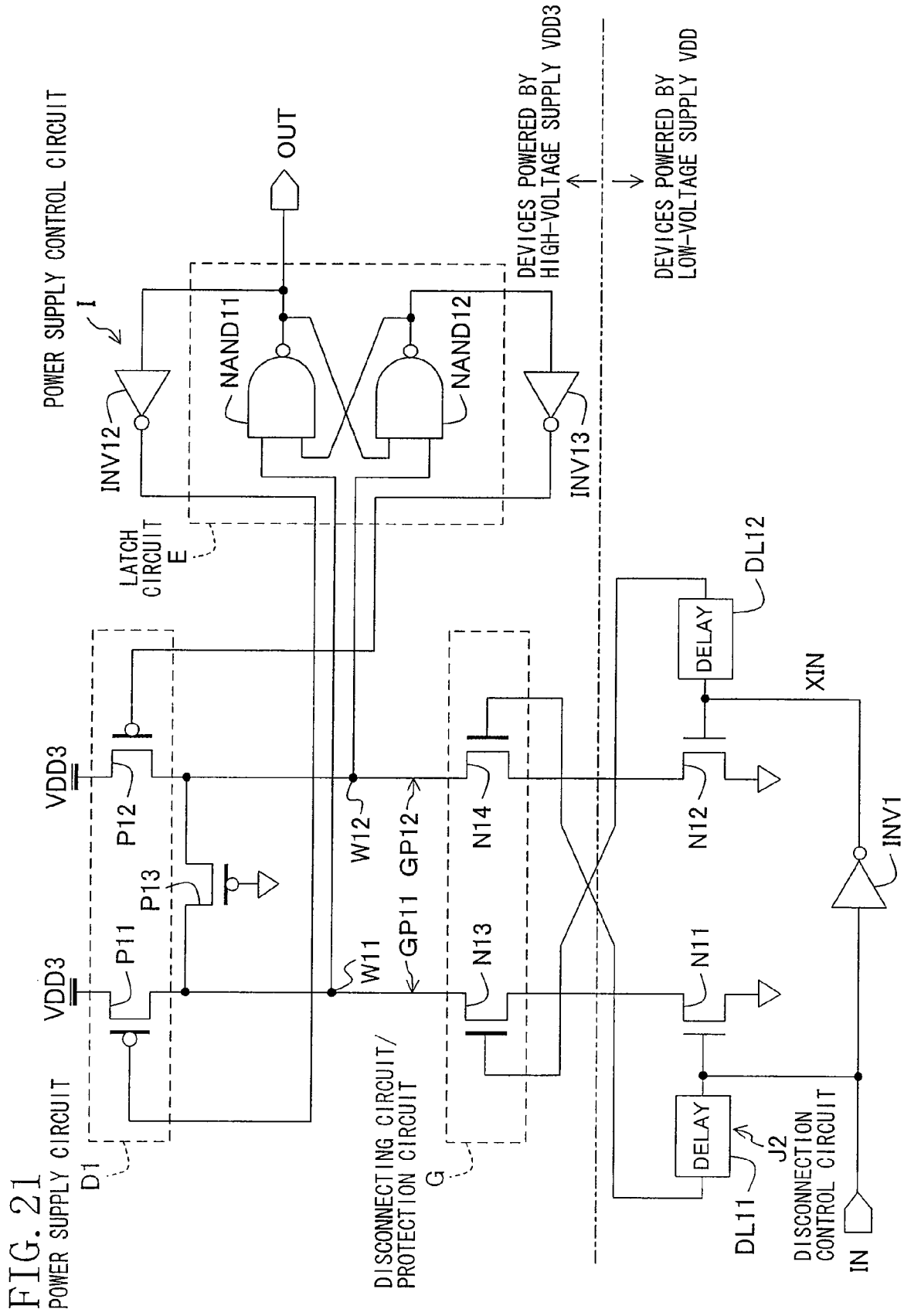

US 7,768,308 B2

LEVEL SHIFT CIRCUIT

CROSS-REFERENCE TO RELATED APPLICATIONS

This non-provisional application is a Divisional of U.S. application Ser. No. 11/808,814, filed Jun. 13, 2007, now abandoned which is a Divisional of U.S. application Ser. No. 11/002,625, filed Dec. 3, 2004, now abandoned and claims priority under 35 U.S.C. §119(a) on Japanese Patent Applications No. 2003-421155 filed in Japan on Dec. 18, 2003 and No. 2004-330249 filed in Japan on Nov. 15, 2004, the entire contents of which are hereby incorporated by references.

BACKGROUND OF THE INVENTION

The present invention relates to level shift circuits for translating logic levels, and more particularly relates to level shift circuits configured to operate at low voltage with reduced power dissipation.

A conventional level shift circuit disclosed in Japanese Patent Publication of examined application Gazette No. 4-40798 has been known. FIG. 14 illustrates the configuration of the conventional level shift circuit.

The level shift circuit shown in FIG. 14 includes two N-type transistors N5 and N6, two cross-coupled P-type transistors P1 and P2, and first and second inverters INV1 and INV2. Each P-type transistor P1 or P2 has its gate connected to the drain of the other. The first inverter INV1 includes an N-type transistor N13 and a P-type transistor P11. The source of the N-type transistor N13 is grounded, while the source of the P-type transistor P11 is connected to a low-voltage supply VDD. The first inverter INV1 is formed by connecting the drains of these transistors with each other and their gates with each other. Likewise, the second inverter INV2 includes an N-type transistor N14 whose source is grounded, and a P-type transistor P12 whose source is connected to the low-voltage supply VDD. The second inverter INV2 is formed by connecting the drains of these transistors with each other and their gates with each other. The first inverter INV1 inverts an input signal received at an input terminal IN, while the second inverter INV2 inverts an inverted signal output from the inverter INV1. The first and second inverters INV1 and INV2 operate powered by the low-voltage supply VDD whose supply voltage is 1.5 V, for example.

All of the devices other than the first and second inverters INV1 and INV2 are high-voltage devices that operate at a high voltage, e.g., 3.3 V, supplied from a high-voltage supply VDD3. The two N-type transistors N5 and N6 receive mutually complimentary signals at their respective sources. More specifically, the source of the N-type transistor N5 receives the inverted version of an input signal from the first inverter INV1, while the source of the N-type transistor N6 receives a signal at the same level as that of the input signal by way of the first and second inverters INV1 and INV2. The gates of the N-type transistors N5 and N6 are connected to the low-voltage supply VDD. The sources of the P-type transistors P1 and P2 are connected to the high-voltage supply VDD3, while their respective drains are connected to the respective drains of the N-type transistors N5 and N6. The connecting point, at which the N-type transistor N6 and the P-type transistor P2 are joined, is connected to an output terminal OUT.

Next, operation of the level shift circuit will be described. When an input signal is at the H level (i.e., the voltage level of the low-voltage supply VDD) and the inverted version of the input signal is at the L (i.e., VSS=0 V) level, the N-type transistor N5 is on, the N-type transistor N6 is off, the P-type transistor P1 is off, and the P-type transistor P2 is on. As a result, the voltage at the output terminal OUT is at the H (i.e., VDD3) level. On the other hand, when the input signal is at the L (i.e., VSS=0 V) level and the inverted version of the input signal is at the H (i.e., VDD) level, the N-type transistor N5 is off, the N-type transistor N6 is on, the P-type transistor P1 is on, and the P-type transistor P2 is off. As a result, the voltage at the output terminal OUT is at the L (i.e., VSS=0 V) level. The level shift circuit shown in FIG. 14, operating in the above-described manner, outputs the signal obtained by level-shifting the input signal at the voltage level of the low-voltage supply VDD to the high-voltage supply VDD3 level.

Nevertheless, if the voltage of the low-voltage supply VDD is set to a low voltage close to the threshold voltage of the N-type transistors N5 and N6, for example, the conventional level shift circuit shown in FIG. 14 does not operate any more. To address this, the threshold voltage of the N-type transistors N5 and N6 is changed to be set to a low voltage of, e.g., 0 V. Then, the conventional level shift circuit of FIG. 14 performs the desired level shifting operation in an excellent manner, even if the voltage of the low-voltage supply VDD is set low.

Now, it will be discussed how the level shift circuit of FIG. 14 operates in the case where the threshold voltage of the N-type transistors N5 and N6 is set to a low voltage. For example, if the input signal is at the L level, the voltage at the drain of the N-type transistor N5 is the voltage of the high-voltage supply VDD3. At this time, the N-type transistor N5 turns off and the potential at a node W3, to which the source of the N-type transistor N5 is connected, is (VDD−threshold voltage). However, if the threshold voltage of the N-type transistor N5 varies to decrease to a negative value due to variations in temperature or variations in the fabrication process, the potential at the node W3 may increase to exceed the voltage of the low-voltage supply VDD. In that case, a current flows from the node W3 via a parasitic diode within the first inverter INV1 into the low-voltage supply VDD, causing an increase in power dissipation.

Another conventional level shift circuit is disclosed in Japanese Laid-Open Publication No. 2001-298356. FIG. 23 illustrates the configuration of this level shift circuit.

The level shift circuit of FIG. 23 performs level shifting of the potential of an input signal powered by a low-voltage supply VDD to the potential of an output signal powered by a high-voltage supply VDD3. The level shift circuit includes: an inverter INV11, which inverts an input signal IN received from an input terminal IN; two N-type transistors N11 and N12, which receive at their respective gates a pair of complementary signals, that is, the input signal IN and the inverted input signal XIN produced from the inverter INV11; a power supply circuit D1 composed of a pair of P-type transistors P11 and P12; and a P-type transistor P13, which operates as a resistor. The power supply circuit D1 supplies the voltage of the high-voltage supply VDD3 to either first or second node W11 or W12 by way of either the P-type transistor P11 or P12.

The level shift circuit further includes a latch circuit E and a disconnecting circuit D2. The latch circuit E includes first and second two-input NAND circuits NAND11 and NAND12, which latch the potentials at the first and second nodes W11 and W12, respectively. The NAND circuit NAND11 is connected at its output side to an output terminal OUT. The disconnecting circuit D2 is composed of a pair of N-type transistors N13 and N14 and disposed in ground paths going from the respective first and second nodes W11 and W12 via the respective N-type complementary-signal-pair-receiving transistors N11 and N12 to the ground, and disconnects the ground paths. The two NAND circuits NAND11 and NAND12 of the latch circuit E are connected at their respective output sides to inverter circuits INV12 and INV13. The inverter circuits INV12 and INV13 function as a power supply control circuit for controlling the power supply circuit D1 and as a disconnection control circuit for controlling the disconnecting circuit D2. Outputs from the inverter circuits INV12 and INV13 are input to the respective gates of the two P-type transistors P11 and P12 of the power supply circuit D1 and to the respective gates of the two N-type transistors N13 and N14 of the disconnecting circuit D2.

In the level shift circuit, the inverter INV11 is composed of a low-voltage device which operates at a low voltage of 1.5 V, for example, supplied from the low-voltage supply VDD. All of the other devices are composed of high-voltage devices which operate at a high voltage of 3.3 V, for example, supplied from the high-voltage supply VDD3.

Next, it will be described how the level shift circuit of FIG. 23 operates. In a steady state, the potentials at the first and second nodes W11 and W12 are both at the H (i.e., VDD3) level. In the case of an input signal at the L (i.e., 0 V) level, the N-type complementary-signal-receiving transistors N11 and N12 are off and on, respectively, and the two outputs (i.e., the respective outputs of the first and second NAND circuits NAND11 and NAND12) from the latch circuit E are at the L (i.e., 0 V) level and at the H (i.e., VDD3) level, respectively, and retain the logic of the respective levels. At this time, the N-type transistors N13 and N14 of the disconnecting circuit D2 are on and off, respectively, and the P-type transistors P11 and P12 of the power supply circuit D1 are off and on, respectively. Since the output of the NAND circuit NAND11 of the latch circuit E is at the L (i.e., 0 V) level, the voltage at the output terminal OUT is at the L (i.e., 0 V) level.

In the above-described state, if the input signal changes from the L (i.e., 0 V) level to the H (i.e., VDD) level, the N-type complementary-signal-receiving transistor N11 turns on. At this time, the N-type transistor N13 of the disconnecting circuit D2 is on, and the potential at the first node W11 changes from the H (i.e., VDD3) level to the L (i.e., 0 V) level, which causes the logic of the latch circuit E to be inverted to the opposite; the output of the NAND circuit NAND11 is inverted to the H (i.e., VDD3) level, while the output of the NAND circuit NAND12 is inverted to the L (i.e., 0 V) level. With this level inversion, the N-type transistor N13 of the disconnecting circuit D2 is turned off, while the P-type transistor P11 of the power supply circuit D1 is turned on, thereby allowing the high-voltage supply VDD3 to precharge the first node W11 to the H (i.e., VDD3) level. On the other hand, the other P-type transistor P12 of the power supply circuit D1 turns off so as to stop precharging of the second node W12 by the high-voltage supply VDD3, while the N-type transistor N14 of the disconnecting circuit D2 turns on so as to connect the second node W12 to the N-type transistor N12 being in the off state, whereby the level shift circuit enters a waiting state in which the level shift circuit waits for the next input signal change. Since the output of the NAND circuit NAND11 of the latch circuit E is at the H (i.e., VDD3) level, the voltage at the output terminal OUT is at the H (i.e., VDD3) level.

Today, in order to reduce power dissipation, for example, there are tendencies to further lower voltage supplied from a power supply. Nevertheless, in the conventional level shift circuit shown in FIG. 23, if the voltage of the low-voltage supply VDD is set to a low voltage close to the threshold voltage of the N-type complementary-signal-receiving high-voltage transistors N11 and N12, it becomes difficult for the N-type complementary-signal-receiving transistors N11 and N12 to operate, causing the level shift circuit to have difficulty in performing the intended operation.

To address this problem, if N-type low-voltage transistors which are capable of withstanding only a low voltage and whose threshold voltage is lower than that of the N-type high-voltage transistors N11 and N12 are employed, the level shift circuit of FIG. 23 can operate as intended, even if the voltage of the low-voltage power supply is set lower than the threshold voltage of the N-type high-voltage transistors N11 and N12.

However, when the conventional level shift circuit shown in FIG. 23 is in the input-signal-change waiting state, the voltage of the high-voltage supply VDD3 at the node W11 or W12 is applied to the drain of either the N-type complementary-signal-receiving transistor N11 or N12 by way of the N-type transistor N13 or N14 being in the on state in the disconnecting circuit D2. Therefore, if these N-type complementary-signal-receiving transistors N11 and N12 are replaced with devices that operate at a low-voltage supplied from the low-voltage supply VDD, these N-type complementary-signal-receiving transistors N11 and N12 will be broken.

SUMMARY OF THE INVENTION

It is therefore an object of the present invention to provide a level shift circuit, in which in a case where the threshold voltage of N-type high-voltage transistors N5 and N6 is set low considering that the power supply voltage of a low-voltage supply VDD is set low, even if the potentials at the sources of those N-type transistors increase beyond the voltage of the low-voltage supply VDD, a current flow into the low-voltage supply VDD is prevented so as to suppress increases in power dissipation.

In order to achieve the above object, the present invention adopts the following structures. In the inventive level shift circuit, unlike in the conventional level shift circuit, an input signal at a low-voltage supply VDD level is not input to the sources of N-type first and second high-voltage transistors, and instead, the input signal is input to the gates of N-type low-voltage transistors, thereby preventing current flow into the low-voltage supply VDD. Furthermore, in the inventive level shift circuit, a protection circuit is interposed between the N-type low-voltage transistors and the N-type high-voltage transistors. The protection circuit restricts the voltage applied to the drains of the N-type low-voltage transistors to a low voltage, thereby preventing the breakdown of the N-type low-voltage transistors.

A second object of the present invention is to provide a level shift circuit, in which N-type complementary-input-signal-pair-receiving transistors present in a level shift circuit such as shown in FIG. 23 are replaced with low-voltage devices, and which operates reliably without causing the breakdown of the N-type transistors, even if the voltage of a low-voltage supply is set low.

To achieve the second object, the inventive level shift circuit employs a configuration in which N-type transistors for receiving a pair of complementary signals are changed from high-voltage devices to low-voltage transistors, and a protection circuit is added for preventing application, to the N-type low-voltage transistors, of a voltage exceeding the withstand voltage of the N-type low-voltage transistors.

More specifically, an inventive level shift circuit includes: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively; two N-type high-voltage transistors, each of which includes first and second terminals, which receive at their respective gates a voltage of the low-voltage supply or the complementary first and second input signals powered by the low-voltage supply, and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively; a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes; and a protection circuit, which includes first, second, third, and fourth terminals connected to the first, second, third, and fourth nodes, respectively, and restricts voltages at the first and second nodes to not more than the voltage of the low-voltage supply.

According to an embodiment of the inventive level shift circuit, the protection circuit includes two N-type protection transistors each including first and second terminals, the first terminals of the N-type protection transistors being connected to the first and second nodes, respectively, the second terminals of the N-type protection transistors being connected to the third and fourth nodes, respectively.

According to an embodiment of the inventive level shift circuit, the voltage of the low-voltage supply is supplied to the gates of the two N-type protection transistors in the protection circuit.

According to an embodiment of the inventive level shift circuit, the complementary first and second input signals are respectively input via delay circuits to the gates of the two N-type protection transistors in the protection circuit.

According to an embodiment of the inventive level shift circuit, the complementary first and second input signals are input directly to the respective gates of the N-type protection transistors in the protection circuit.

According to an embodiment of the inventive level shift circuit, the protection circuit includes two protection diodes which are respectively connected to the first and second nodes at their respective cathodes and to the third and fourth nodes at their respective anodes.

According to an embodiment of the inventive level shift circuit, the voltage of the low-voltage supply is supplied to the respective gates of the two N-type high-voltage transistors.

According to an embodiment of the inventive level shift circuit, a stop mode signal, which is put to a low potential level when the level shift circuit is to be stopped, is input to the gates of the two N-type high-voltage transistors.

According to an embodiment of the inventive level shift circuit, the complementary first and second input signals are respectively input via delay circuits to the gates of the two N-type high-voltage transistors.

According to an embodiment of the inventive level shift circuit, the complementary first and second input signals are input directly to the gates of the two N-type high-voltage transistors, respectively.

According to an embodiment of the inventive level shift circuit, the inventive level shift circuit further includes first and second clamp circuits, which are disposed between the low-voltage supply and the third and fourth nodes, respectively, and which clamp voltages at the third and fourth nodes to the voltage of the low-voltage supply.

According to an embodiment of the inventive level shift circuit, individual threshold voltages of the two N-type high-voltage transistors are set lower than individual threshold voltages of the two N-type signal-receiving low-voltage transistors.

As described above, the inventive level shift circuit has the configuration in which the two N-type high-voltage transistors are respectively connected in series with the two N-type complementary-signal-receiving transistors, which receive the low-voltage complementary signals at their respective gates. Therefore, there is no current path going from the source terminals of the N-type high-voltage transistors to inverters for generating the complementary signals. Accordingly, unlike in the conventional circuits, current flow, going from the source terminals of the N-type high-voltage transistors into the low-voltage supply VDD via parasitic diodes in the complementary-signal-generating inverters, is prevented.

In addition, even if the voltages at the source terminals of the N-type high-voltage transistors are increased to a high voltage exceeding the voltage of the low-voltage supply VDD, the protection circuit, which is interposed between the N-type high-voltage transistors and the N-type complementary-signal-receiving transistors, restricts the drain potentials of the N-type complementary-signal-receiving transistors to less than the voltage of the low-voltage supply VDD. This reliably prevents application of a potential equal to or higher than the voltage of the low-voltage supply VDD between the terminals of the N-type complementary-signal-receiving transistors.

Moreover, in one embodiment of the inventive level shift circuit, the sources of the two N-type high-voltage transistors are respectively connected to the clamp circuits, which clamp the source potentials of those N-type transistors to the voltage of the low-voltage supply VDD. Thus, even if the source potentials of those N-type high-voltage transistors increase beyond the voltage of the low-voltage supply VDD, it is possible to restrict those source potentials to not more than the voltage of the low-voltage supply VDD. Therefore, application of the voltage of the low-voltage supply VDD between the terminals of the protection circuit is also prevented reliably.

Furthermore, in another embodiment of the inventive level shift circuit, the threshold voltage of the two N-type high-voltage transistors is set low, so that the level shift circuit operates reliably, even if the voltage of the low-voltage supply VDD is set low.

A second inventive level shift circuit is a level shift circuit for receiving complementary first and second signals powered by a low-voltage supply and performing level shifting of potentials of the first and second signals to a potential of a high-voltage supply. The second inventive level shift circuit includes: two N-type signal-receiving low-voltage transistors, which receive at their respective gates the complementary first and second input signals, and each of which has first and second terminals, the first terminals of the N-type signal-receiving low-voltage transistors being grounded, the second terminals of the N-type signal-receiving low-voltage transistors being connected to first and second nodes, respectively; a power supply circuit, which includes a first terminal connected to the high-voltage supply, a second terminal connected to the first node, and a third terminal connected to the second node, and supplies a voltage of the high-voltage supply to one of the first and second nodes, while blocking the supply of the voltage of the high-voltage supply to the other of the first and second nodes; a power supply control circuit for controlling the power supply circuit; a resistor for connecting the first and second nodes: a latch circuit for latching potentials at the first and second nodes; a disconnecting circuit, which is disposed in two ground paths going from the respective first and second nodes via the respective two N-type signal-receiving low-voltage transistors to the ground, and which disconnects one of the two ground paths and connects the other of the two ground paths; a disconnection control circuit for controlling the disconnecting circuit; and a protection circuit, which is disposed between the first node and one of the two N-type signal-receiving low-voltage transistors and between the second node and the other of the two N-type signal-receiving low-voltage transistors, and restricts a voltage applied between the two terminals of each of the two N-type low-voltage transistors to not more than a withstand voltage of the two N-type low-voltage transistors.

According to an embodiment of the second inventive level shift circuit, the protection circuit also functions as the disconnecting circuit.

According to an embodiment of the second inventive level shift circuit, the protection circuit is formed by disposing an N-type transistor in each of the two ground paths.

According to an embodiment of the second inventive level shift circuit, the protection circuit is formed by disposing two N-type transistors in series in each of the two ground paths.

According to an embodiment of the second inventive level shift circuit, the protection circuit is formed by disposing an N-type transistor and a diode in series in each of the two ground paths.

According to an embodiment of the second inventive level shift circuit, the protection circuit includes a clamp circuit, which connects connecting points, at each of which the series-circuit forming two devices are joined, with the low-voltage supply and clamps individual potentials at the connecting points to the voltage of the low-voltage supply.

According to an embodiment of the second inventive level shift circuit, one or ones of circuits other than the protection circuit include an N-type high-voltage transistor capable of withstanding the voltage of the high-voltage supply, and the protection circuit includes an N-type transistor whose threshold voltage is set lower than a threshold voltage of the N-type high-voltage transistor.

According to an embodiment of the second inventive level shift circuit, the disconnection control circuit controls the disconnecting circuit based on the potentials at the first and second nodes latched by the latch circuit, so that one of the two ground paths is connected, while the other of the two ground paths is disconnected.

According to an embodiment of the second inventive level shift circuit, the disconnection control circuit receives the complementary first and second input signals and controls the disconnecting circuit based on the received complementary first and second input signals, so that one of the two ground paths is connected, while the other of the two ground paths is disconnected.

According to an embodiment of the second inventive level shift circuit, the disconnection control circuit includes two inverter circuits for inverting the complementary first and second input signals, respectively.

According to an embodiment of the second inventive level shift circuit, the disconnection control circuit includes two delay circuits for respectively delaying the complementary first and second input signals by a fixed amount of time.

According to an embodiment of the second inventive level shift circuit, the latch circuit has first and second NAND circuits; the first NAND circuit receives the potential at the first node and an output produced from the second NAND circuit; and the second NAND circuit receives the potential at the second node and an output produced from the first NAND circuit.

According to an embodiment of the second inventive level shift circuit, the disconnection control circuit, powered by the high-voltage supply, generates a high-voltage control signal, and the protection circuit, which also functions as the disconnecting circuit, includes a lowering circuit for lowering the high-voltage control signal produced from the disconnection control circuit to the voltage of the low-voltage supply.

As described above, the second inventive level shift circuit, the N-type transistors for receiving the complementary signal pair are composed of low-voltage transistors whose threshold voltage is low. Thus, even if the voltage of the low-voltage supply is set to a lower voltage, the low-voltage transistors operate as intended, allowing the level shift circuit to reliably perform the desired level shifting operation. In addition, the protection circuit prevents application, between the two terminals of the N-type complementary-signal-pair-receiving transistors, of a voltage exceeding the withstand voltage of the N-type complementary-signal-pair-receiving transistors, thereby preventing the breakdown of the N-type complementary-signal-receiving transistors.

BRIEF DESCRIPTION OF THE DRAWINGS

FIG. 13A is a view illustrating an exemplary clamp circuit composed of a diode, employed in the level shift circuit of the eighth embodiment, while

FIGS. 18A through 18G are views illustrating modified examples of a protection circuit employed in the level shift circuits of the ninth through eleventh embodiments of the present invention.

FIG. 19 is a view illustrating the configuration of a level shift circuit in accordance with a twelfth embodiment of the present invention.

FIG. 21 is a view illustrating the configuration of a level shift circuit in accordance with a fourteenth embodiment of the present invention.

DESCRIPTION OF THE PREFERRED EMBODIMENTS

Hereinafter, preferred embodiments of the present invention will be described with reference to the accompanying drawings.

First Embodiment

Figure 1:
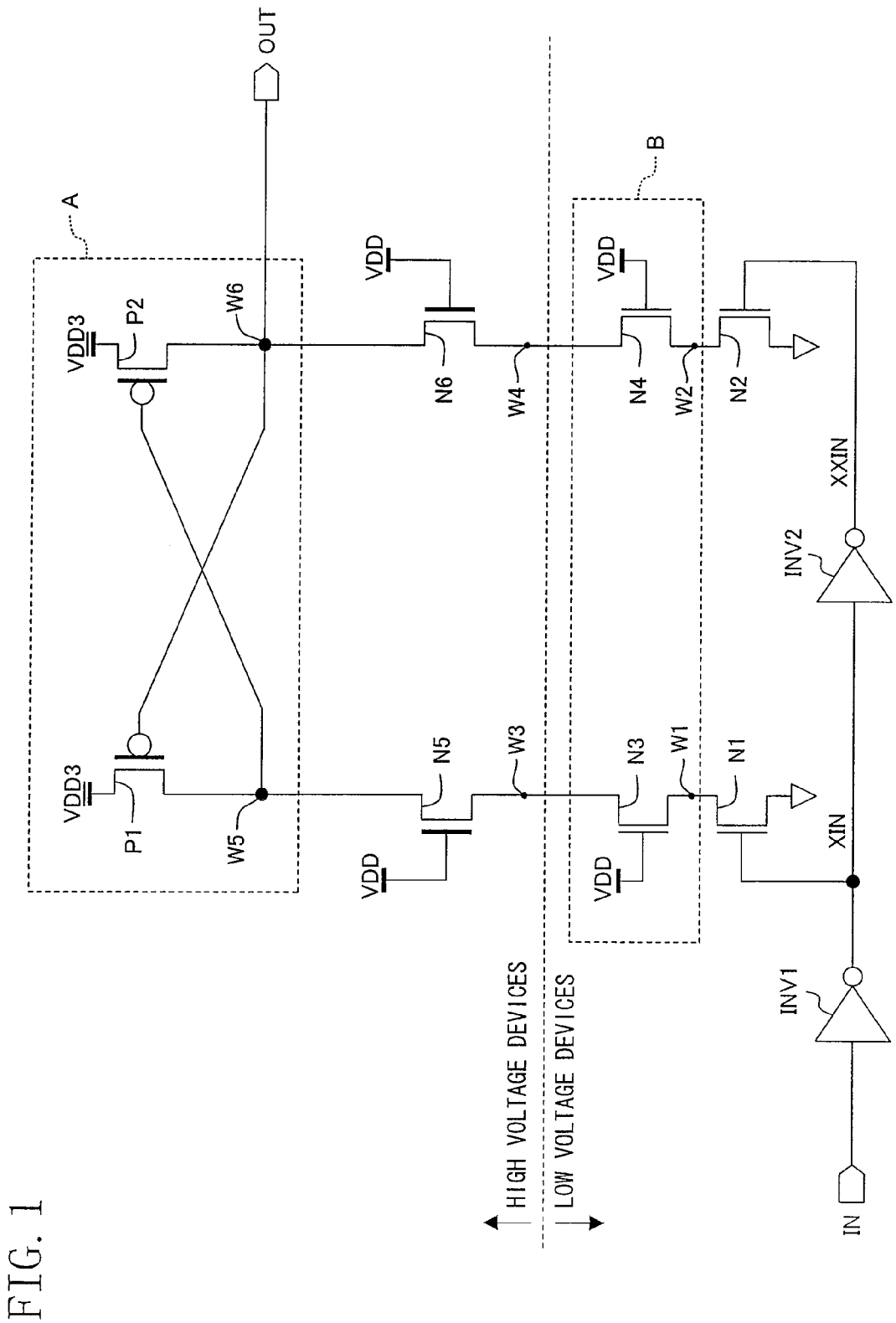
FIG. 1 is a view illustrating the configuration of a level shift circuit in accordance with a first embodiment of the present invention.

FIG. 1 is a view illustrating the specific configuration of a level shift circuit in accordance with this embodiment.

In FIG. 1, the reference mark IN denotes a signal input terminal, the reference mark INV1 denotes an inverter for inverting a signal input to the input terminal IN, and the reference mark INV2 denotes an inverter which inverts a signal output from the inverter INV1. The inverters INV1 and INV2 operate at a voltage of 1.5 V, for example, supplied from a low-voltage supply VDD.

In FIG. 1, the reference marks N1 and N2 denote N-type low-voltage transistors which receive a pair of complementary signals and are capable of withstanding only low voltage (which will be hereinafter refereed to as "N-type complementary-signal-receiving low-voltage transistors.) The N-type complementary-signal-receiving low-voltage transistors N1 and N2 have their respective sources grounded. A signal XIN (which is one of first and second signals serving as the complementary signals) inverted by the inverter INV1 is input to the gate of the N-type transistor (i.e., a first N-type transistor) N1. A signal XXIN (which is the other of the first and second signals serving as the complementary signals) inverted by the inverter INV2 is input to the gate of the other N-type transistor (i.e., a second N-type transistor) N2.

The drain of the N-type signal-receiving transistor N1 is connected to an N-type protection transistor (i.e., a third N-type transistor) N3 and their connecting point serves as a first node W1. The gate of the N-type protection transistor N3 is connected to the low-voltage supply VDD. Likewise, the drain of the N-type signal-receiving transistor N2 is connected to an N-type protection transistor (i.e., a fourth N-type transistor) N4 and their connecting point is a second node W2. The gate of the N-type protection transistor N4 is connected to the low-voltage supply VDD.

In the level shift circuit shown in FIG. 1, all of the devices but the inverters INV1 and INV2, the N-type complementary-signal-receiving transistors N1 and N2, and the two N-type protection transistors N3 and N4 are high-voltage devices that operate at a high voltage, e.g., 3.3 V, supplied from a high-voltage supply VDD3. Such devices capable of withstanding high voltage will be hereinafter referred to as "high-voltage devices".

The drain of the N-type protection transistor N3 is connected to an N-type high-voltage transistor (i.e., a fifth N-type transistor) N5 and their connecting point serves as a third node W3. The voltage of the low-voltage supply VDD is input to the gate of the N-type high-voltage transistor N5. The drain of the N-type protection transistor N4 is connected to an N-type high-voltage transistor (i.e., a sixth N-type transistor) N6 and their connecting point is a fourth node W4. The voltage of the low-voltage supply VDD is input to the gate of the N-type high-voltage transistor N6.

In FIG. 1, the reference marks P1 and P2 denote a pair of P-type transistors. The sources of the P-type transistors P1 and P2 are connected to the high-voltage supply VDD3. The gate of each P-type transistor is cross-coupled to the drain of the other, and their respective drains are connected to the drains of the N-type high-voltage transistors N5 and N6. The connecting point, at which the P-type transistor (i.e., a first P-type transistor) P1 and the N-type high-voltage transistor N5 are connected together, serves as a fifth node W5, and the connecting point, at which the other P-type transistor (i.e., a second P-type transistor) P2 and the N-type high-voltage transistor N6 are connected together, is a sixth node W6. An output terminal OUT is connected to the sixth node W6. The two P-type transistors P1 and P2 form a power supply circuit A, while the two N-type protection transistors N3 and N4 form a protection circuit B.

The threshold voltage of the N-type complementary-signal-receiving transistors N1 and N2 is set to a typical value, for example, 0.3 V. On the other hand, the threshold voltage of the N-type high-voltage transistors N5 and N6 is set to a voltage of 0 V, for example, that is lower than the threshold voltage (0.3 V) of the N-type complementary-signal-receiving transistors N1 and N2. The threshold voltage of the two N-type transistors N3 and N4 forming the protection circuit B is set to 0.3 V, for example, as in the case of the N-type complementary-signal-receiving transistors N1 and N2. The threshold voltage of the pair of P-type transistors P1 and P2 is set to a typical value, for example, 0.7 V.

Hereinafter, it will be described how the level shift circuit having the above-mentioned configuration operates. First, in a steady state in which the potential of a signal received at the input terminal IN is at the H (i.e., VDD) level, the N-type transistor N1 is off, the N-type transistor N2 is on, the N-type transistor N4 is on, the N-type transistor N6 is on, the P-type transistor P1 is on, the P-type transistor P2 is off, the N-type transistor N5 is off, and the N-type transistor N3 is off. The fifth node W5 has the potential (3.3 V) of the high-voltage supply VDD3, while the potential at the sixth node W6 is 0 V. As a result, the voltage of the output terminal OUT is at the L (0 V) level.

The two N-type signal-receiving transistors N1 and N2 are composed of low-voltage devices capable of withstanding the voltage of the low-voltage supply VDD and their threshold voltage is a typical value of 0.3 V. If these transistors N1 and N2 are composed of high-voltage devices capable of withstanding the voltage of the high-voltage supply VDD3, their threshold voltage will be a typical value of, e.g., 0.7 V. Therefore, in this embodiment, even if the voltage of the low-voltage supply VDD is set lower by the amount of voltage reduction (i.e., 0.4 V=0.7 V−0.3 V) in the threshold voltage, the level shift circuit of FIG. 1 operates as intended.

In addition, when the N-type signal-receiving low-voltage transistor N1 is in the off state, the N-type high-voltage transistor N5 is also in the off state, so that the potential (3.3 V supplied from the high-voltage supply VDD3) at the fifth node W5 is not applied to the N-type signal-receiving low-voltage transistor N1 being in the off state, thereby preventing the breakdown of the N-type low-voltage transistor N1. Moreover, even if the voltage of the low-voltage supply VDD, to which the gate of the N-type high-voltage transistor N5 is connected, is set lower, the N-type high-voltage transistor N5 operates in an excellent manner, because the threshold voltage of the N-type high-voltage transistor N5 is 0 V, which is lower than a typically employed value.

Furthermore, if the threshold voltage of the N-type high-voltage transistor N5 varies to drop below 0 V and become a negative value due to factors such as variations in temperature or variations in the fabrication process, the potential at the node W3 increases to exceed the voltage of the low-voltage supply VDD. Even in that case, the N-type protection transistor N3 allows the potential at the node W1 to become the voltage of (VDD−threshold voltage=VDD−0.3 V), which prevents application of a voltage exceeding the voltage of the low-voltage supply VDD between the terminals of the N-type signal-receiving transistor N1.

Moreover, since the inverted signal XIN produced from the inverter INV1 is input to the gate of the N-type signal-receiving transistor N1, no current flows from the node W3 via a parasitic diode within the inverter INV1 into the low-voltage supply VDD.

On the other hand, in a steady state in which the potential of the signal at the input terminal IN is at the L (i.e., 0 V) level, the N-type transistor N1 is on, the N-type transistor N2 is off, the N-type transistor N3 is on, the N-type transistor N5 is on, the P-type transistor P1 is off, the P-type transistor P2 is on, the N-type transistor N6 is off, and the N-type transistor N4 is off. The potential at the fifth node W5 is 0 V, while the sixth node W6 has the potential (3.3 V) of the high-voltage supply VDD3. As a result, the voltage at the output terminal OUT is at the H (3.3 V) level.

In this case, the effects achieved in the above-described steady state in which the potential of the signal received at the input terminal IN is at the H (VDD) level are also attained. More specifically, even if the voltage of the low-voltage supply VDD is set lower, the level shift circuit of FIG. 1 operates as intended, because the two N-type signal-receiving transistors N1 and N2 are composed of the low-voltage devices and their threshold voltage is as low as 0.3 V; with the N-type high-voltage transistor N6 being in the off state, application of the voltage of the high-voltage supply VDD3 to the N-type low-voltage transistor N2 is prevented; and even if the voltage of the low-voltage supply VDD is lowered further, the N-type high-voltage transistor N6 operates in an excellent manner.

Moreover, even if the threshold voltage of the N-type high-voltage transistor N6 varies to decrease due to factors such as variations in temperature or variations in the fabrication process, causing the potential at the node W4 to increase beyond the voltage of the low-voltage supply VDD, the N-type protection transistor N4 allows the potential at the node W2 to be the voltage of (VDD−threshold voltage). This prevents application of a voltage exceeding the voltage of the low-voltage supply VDD between the terminals of the N-type signal-receiving transistor N2.

In addition, since the inverted signal XXIN (=IN) produced from the inverter INV2 is input to the gate of the N-type signal-receiving transistor N2, no current flows from the node W4 via a parasitic diode within the inverter INV2 into the low-voltage supply VDD.

The threshold voltage of the N-type high-voltage transistors N5 and N6 is set as low as about 0 V, for example. Therefore, even if the voltage of the low-voltage supply VDD is set low, the level shift circuit of FIG. 1 operates reliably.

(First Modified Example of the First Embodiment)

Figure 2:
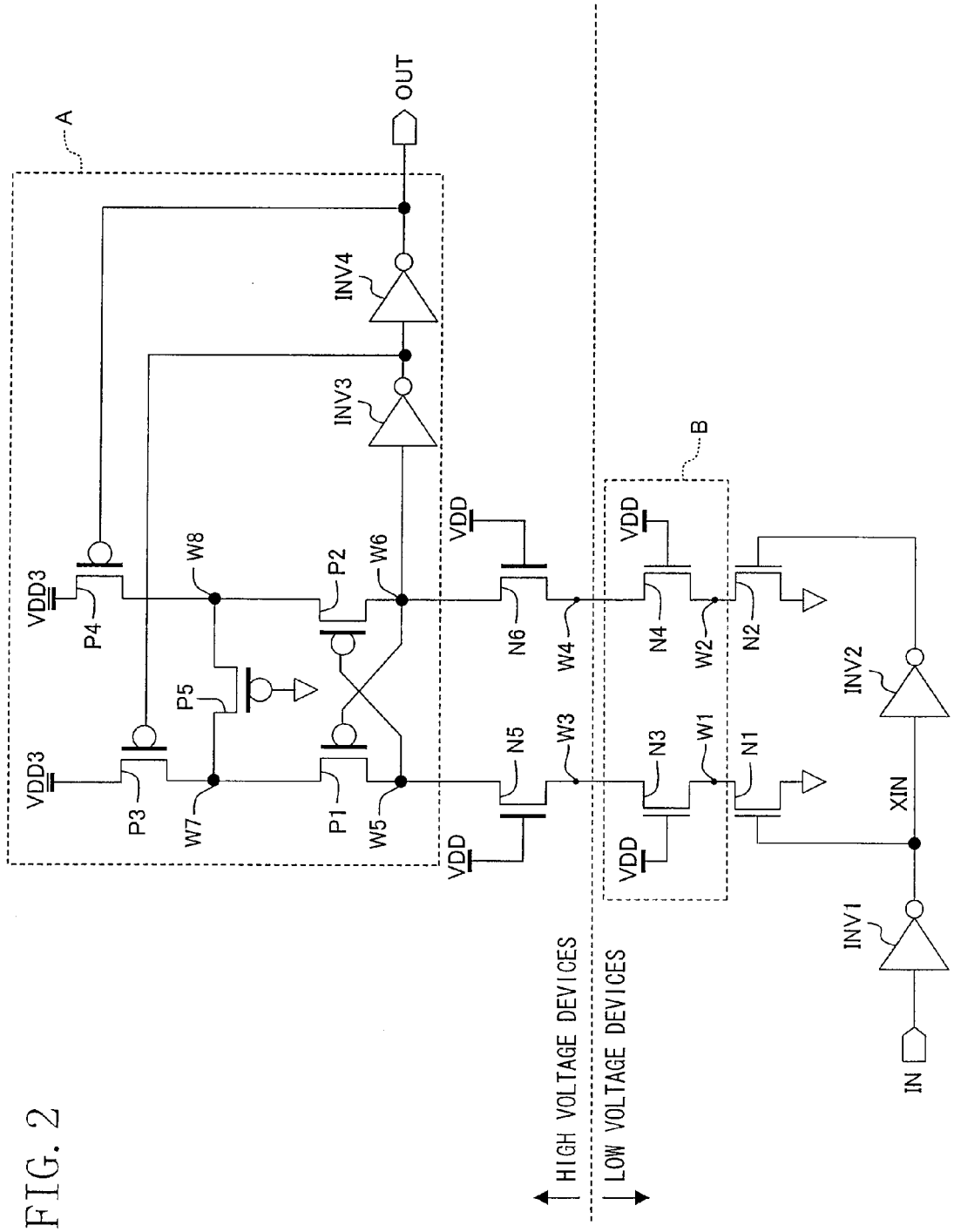
FIG. 2 is a view illustrating a first modified example of the level shift circuit of the first embodiment.

FIG. 2 illustrates a first modified example of the first embodiment.

This modified example is obtained by making modifications to the internal configuration of the power supply circuit A of the first embodiment. More specifically, in the power supply circuit A shown in FIG. 2, the reference marks P1 and P2 denote a pair of P-type transistors. The sources of the P-type transistors P1 and P2 are connected to a high-voltage supply VDD3, while the gate of each P-type transistor is cross-coupled to the drain of the other. And their respective drains are connected to the drains of N-type transistors N5 and N6. The connecting point, at which the P-type transistor (i.e., a first P-type transistor) P1 and the N-type transistor N5 are connected together, is a fifth node W5, and the connecting point, at which the other P-type transistor (i.e., a second P-type transistor) P2 and the N-type transistor N6 are connected together, is a sixth node W6.

The reference marks P3 and P4 denote a pair of current-blocking transistors composed of P-type transistors. The sources of the current-blocking transistors P3 and P4 are connected to the high-voltage supply VDD3, and their drains are connected to the respective sources of the P-type transistors P1 and P2. The connecting point, at which the current-blocking transistor (i.e., a third P-type transistor) P3 and the first P-type transistor P1 are connected together, is a seventh node W7, and the connecting point, at which the other current-blocking transistor (i.e., a fourth P-type transistor) P4 and the second P-type transistor P2 are connected together, is an eighth node W8. The gate of the current-blocking transistor P3 is connected to the sixth node W6 via an inverter INV3, while the gate of the other current-blocking transistor P4 is connected to the sixth node W6 via the inverter INV3 and an inverter INV4. The inverter INV4 is connected at its output side to an output terminal OUT. Moreover, the reference mark P5 denotes a resistor composed of a P-type transistor whose gate is grounded. One end of the resistor P5 is connected to the seventh node W7, while the other end thereof is connected to the eighth node W8.

In the level shift circuit of FIG. 2 with the above-described configuration, N-type complementary-signal-receiving low-voltage transistors N1 and N2, the N-type high-voltage transistors N5 and N6, and a protection circuit B are the critical members of the present invention and are the same as those described in the first embodiment. It should be noted that although the power supply circuit A of this modified example operates in a different manner than that of the first embodiment, the description thereof is omitted herein, because the operation of the power supply circuit A is not critical in the present invention.

(Second Modified Example of the First Embodiment)

Figure 3:
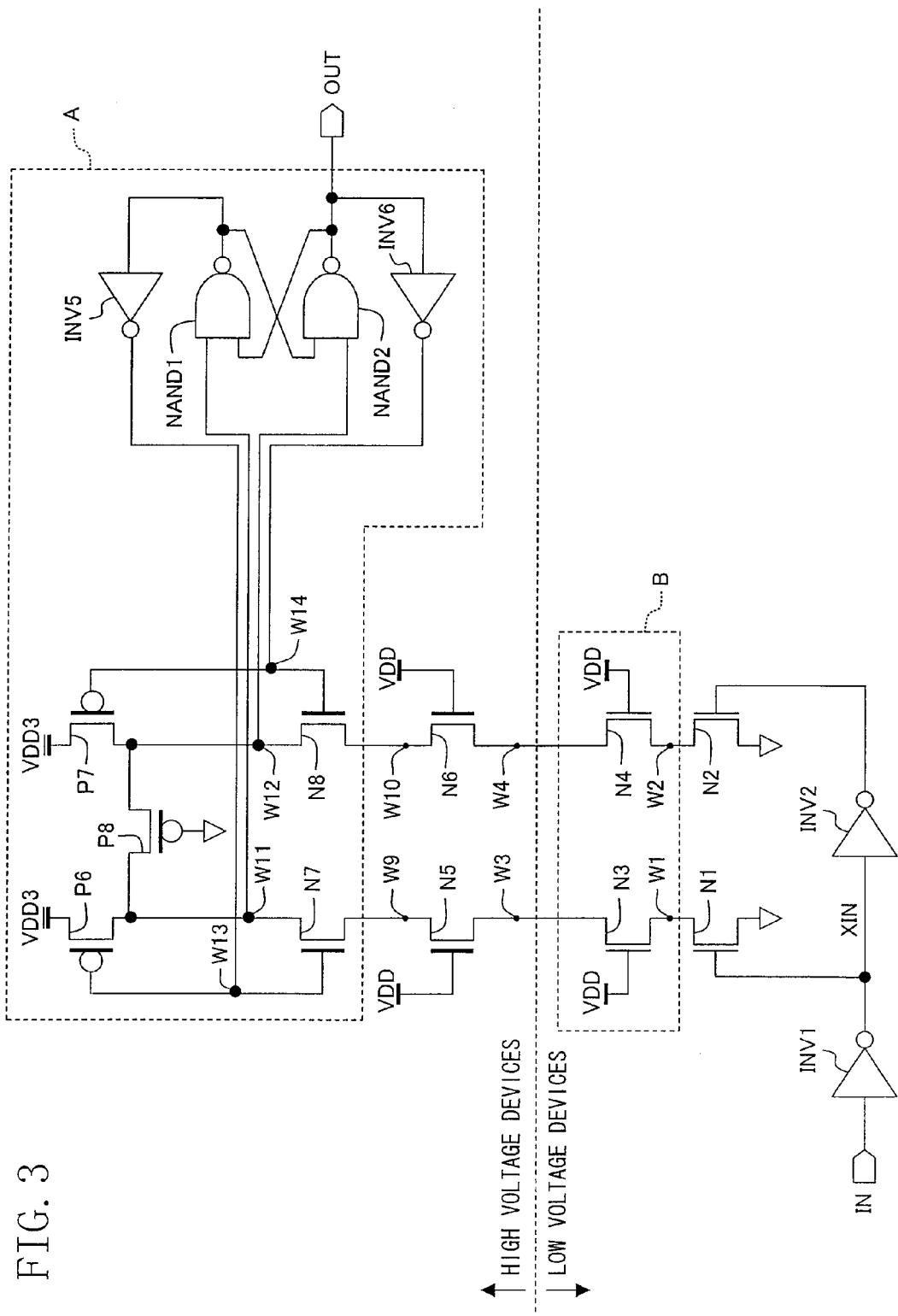
FIG. 3 is a view illustrating a second modified example of the level shift circuit of the first embodiment.

FIG. 3 illustrates a second modified example of the first embodiment.

This modified example is obtained by making other modifications to the internal configuration of the power supply circuit A of the first embodiment.

More specifically, the power supply circuit A of FIG. 3 includes a precharge circuit composed of: a supply circuit consisting of a pair of P-type transistors P6 and P7; a disconnecting circuit consisting of a pair of N-type transistors N7 and N8; and a P-type transistor P8 operating as a resistor. The P-type transistor P6 has its source connected to a high-voltage supply VDD3 and its drain to a fifth node W11. The other P-type transistor P7 has its source connected to the high-voltage supply VDD3 and its drain to a sixth node W12. In the precharge circuit shown in FIG. 3, the N-type transistor N7 is disposed between the fifth node W11 and an N-type transistor N5, while the other N-type transistor N8 is disposed between the sixth node W12 and an N-type transistor N6. The P-type transistor P8 is connected to the drains of the two P-type transistors P6 and P7 (i.e., the fifth and sixth nodes W11 and W12.)

The power supply circuit A of FIG. 3 further includes a flip-flop circuit including first and second two-input NAND circuits NAND1 and NAND2, and a precharge control circuit composed of two inverters INV5 and INV6. The first NAND circuit NAND1 receives the potential at the fifth node W11 and an output signal produced from the second NAND circuit NAND2, while the second NAND circuit NAND2 receives the potential at the sixth node W12 and an output signal produced from the first NAND circuit NAND1. These outputs from the first and second NAND circuits are outputs produced from the flip-flop circuit. The precharge control circuit controls operation of the precharge circuit. Upon receiving the output of the first NAND circuit NAND1 of the flip-flop circuit, the inverter INV5 inverts the signal received and outputs its inverted signal to the gate of the P-type transistor P6 and to the gate of the N-type transistor N7 in the precharge circuit. The other inverter INV6, upon receiving the output of the second NAND circuit NAND2 of the flip-flop circuit, inverts the signal received and outputs its inverted signal to the gate of the P-type transistor P7 and to the gate of the N-type transistor N8 in the precharge circuit.

In the level shift circuit of FIG. 3 with the above-described configuration, N-type complementary-signal-receiving low-voltage transistors N1 and N2, the N-type high-voltage transistors N5 and N6, and a protection circuit B are the critical members of the present invention and are the same as those described in the first embodiment. It should be noted that although the power supply circuit A of this modified example operates in a different manner than that of the first embodiment, the description thereof is omitted herein, because the operation of the power supply circuit A is not critical in the present invention.

Second Embodiment

Figure 4:
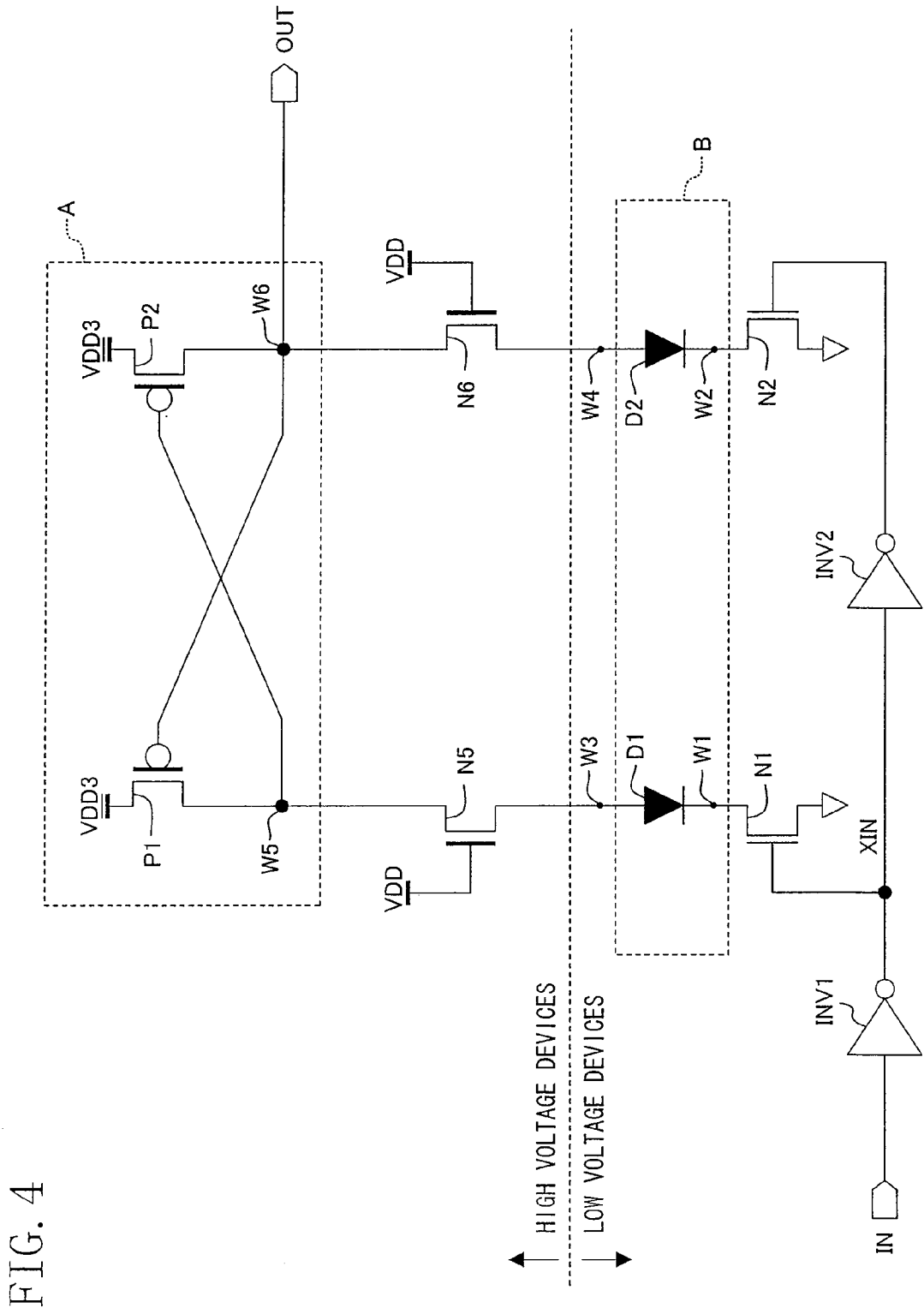
FIG. 4 is a view illustrating the configuration of a level shift circuit in accordance with a second embodiment of the present invention.

FIG. 4 is a view illustrating the specific configuration of a level shift circuit in accordance with this embodiment.

In the configuration shown in FIG. 4, the protection circuit B in the level shift circuit of the first embodiment shown in FIG. 1 is composed of diodes. More specifically, the N-type transistors N3 and N4 of FIG. 1 are replaced with protection diodes D1 and D2, respectively. The protection diode D1 has its cathode connected to a node W1 and its anode to a node W3. Similarly, the protection diode D2 has its cathode connected to a node W2 and its anode to a node W4.

In the level shift circuit configured in the above manner, the potentials at the nodes W1 and W2 are respectively lower than the potentials at nodes W3 and W4 by the respective threshold voltages of the diodes D1 and D2, thereby preventing application of a voltage exceeding the voltage of a low-voltage supply VDD between the terminals of N-type signal-receiving transistors N1 and N2. In other respects, the circuit operates and functions in the same manner as in the first embodiment.

Figure 5:
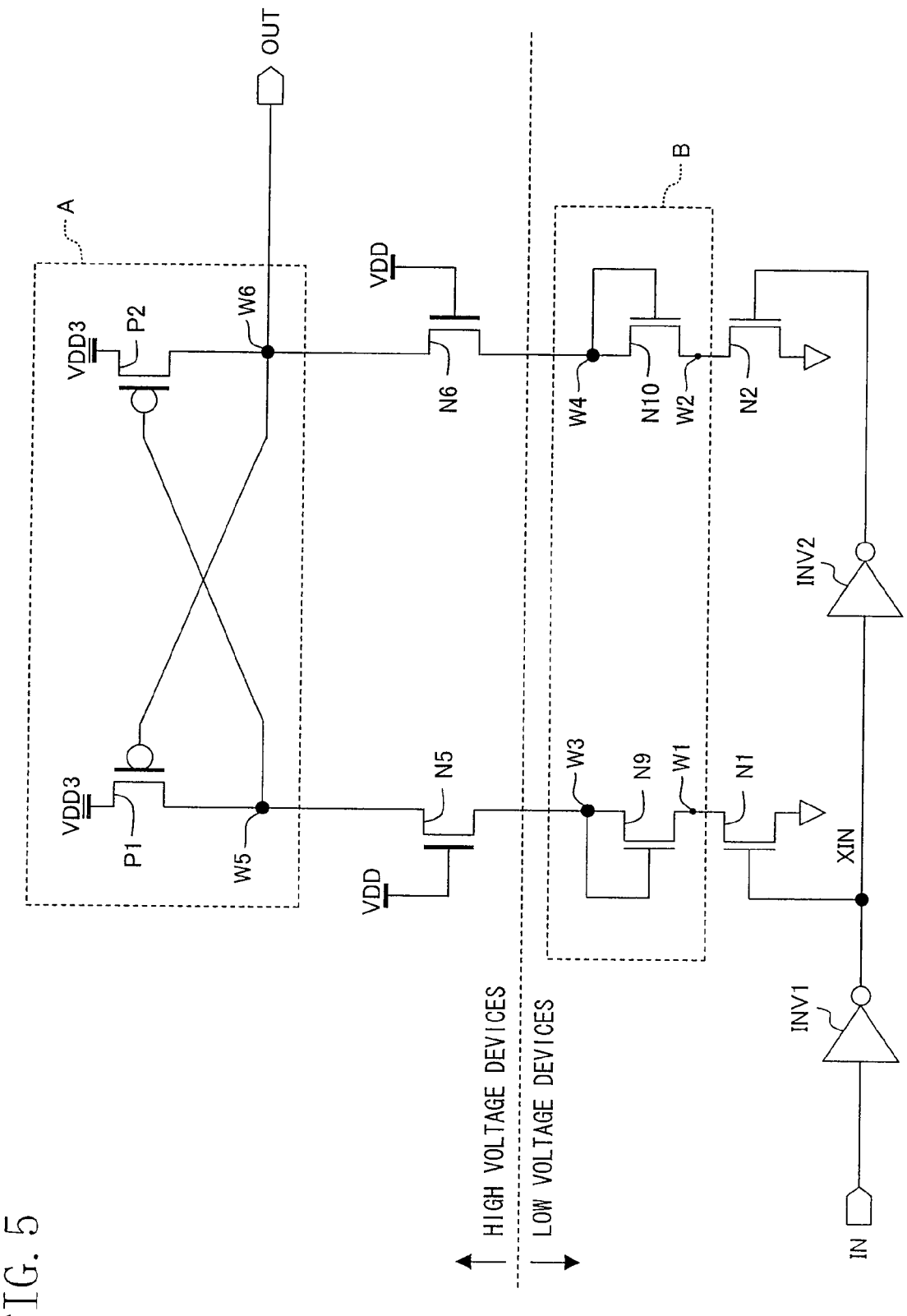
FIG. 5 is a view illustrating the specific configuration of a level shift circuit in which diodes employed in the level shift circuit of the second embodiment are replaced with N-type transistors.

As shown in FIG. 5, the diodes D1 and D2 may be replaced with N-type transistors N9 and N10. The N-type transistor N9 is connected between the nodes W1 and W3 and the gate thereof is connected to the node W3. The other N-type transistor N10 is connected between the nodes W2 and W4 and the gate thereof is connected to the node W4.

Figure 6:
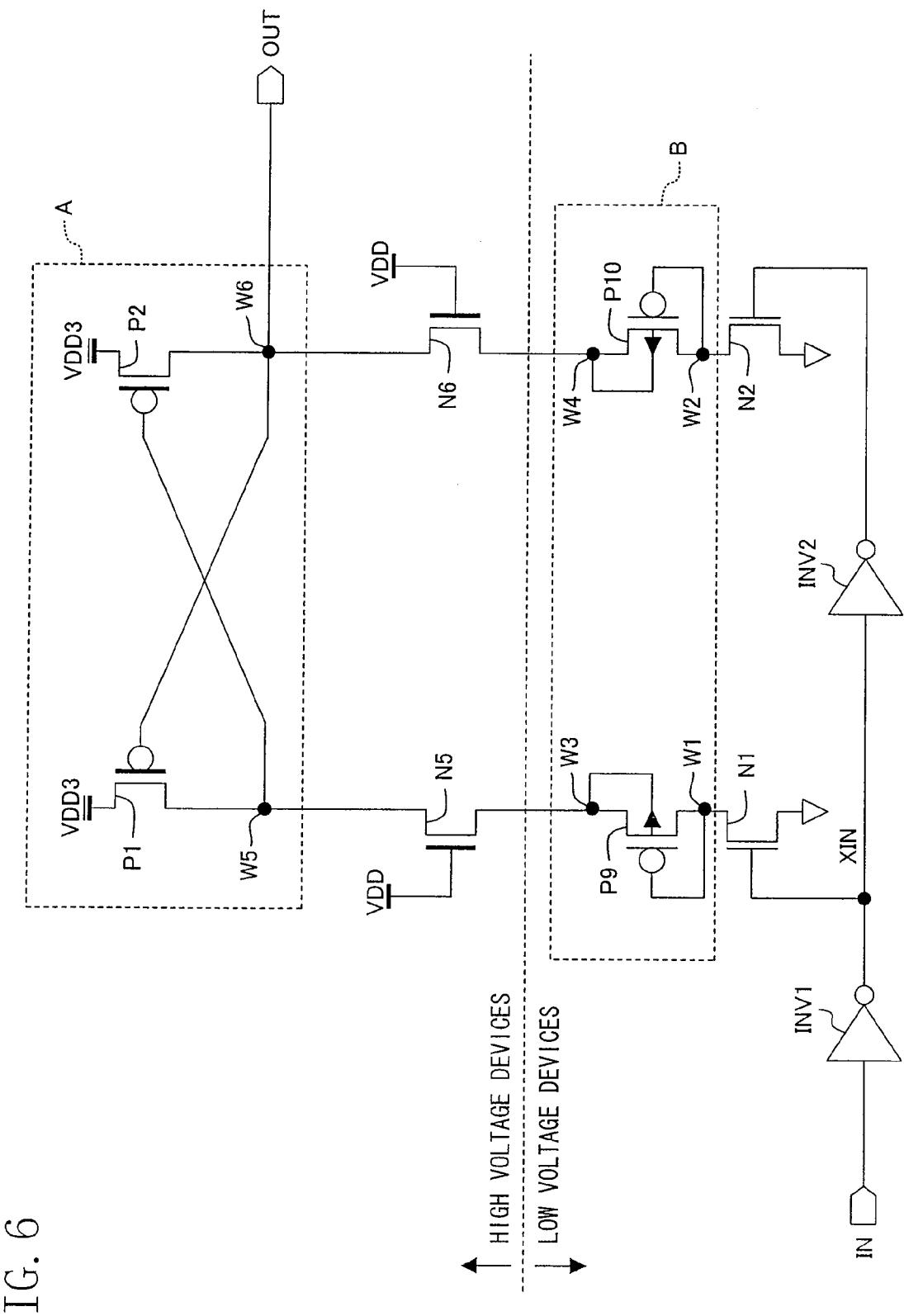
FIG. 6 a view illustrating the specific configuration of a level shift circuit in which the diodes employed in the level shift circuit of the second embodiment are replaced with P-type transistors.

Alternatively, as shown in FIG. 6, the diodes D1 and D2 may be replaced with P-type transistors P9 and P10. The P-type transistor P9 is connected between the nodes W1 and W3 and has its gate connected to the node W1 and its back-bias node to the node W3. The other P-type transistor P10 is connected between the nodes W2 and W4 and has its gate connected to the node W2 and its back-bias node to the node W4.

Third Embodiment

Figure 7:
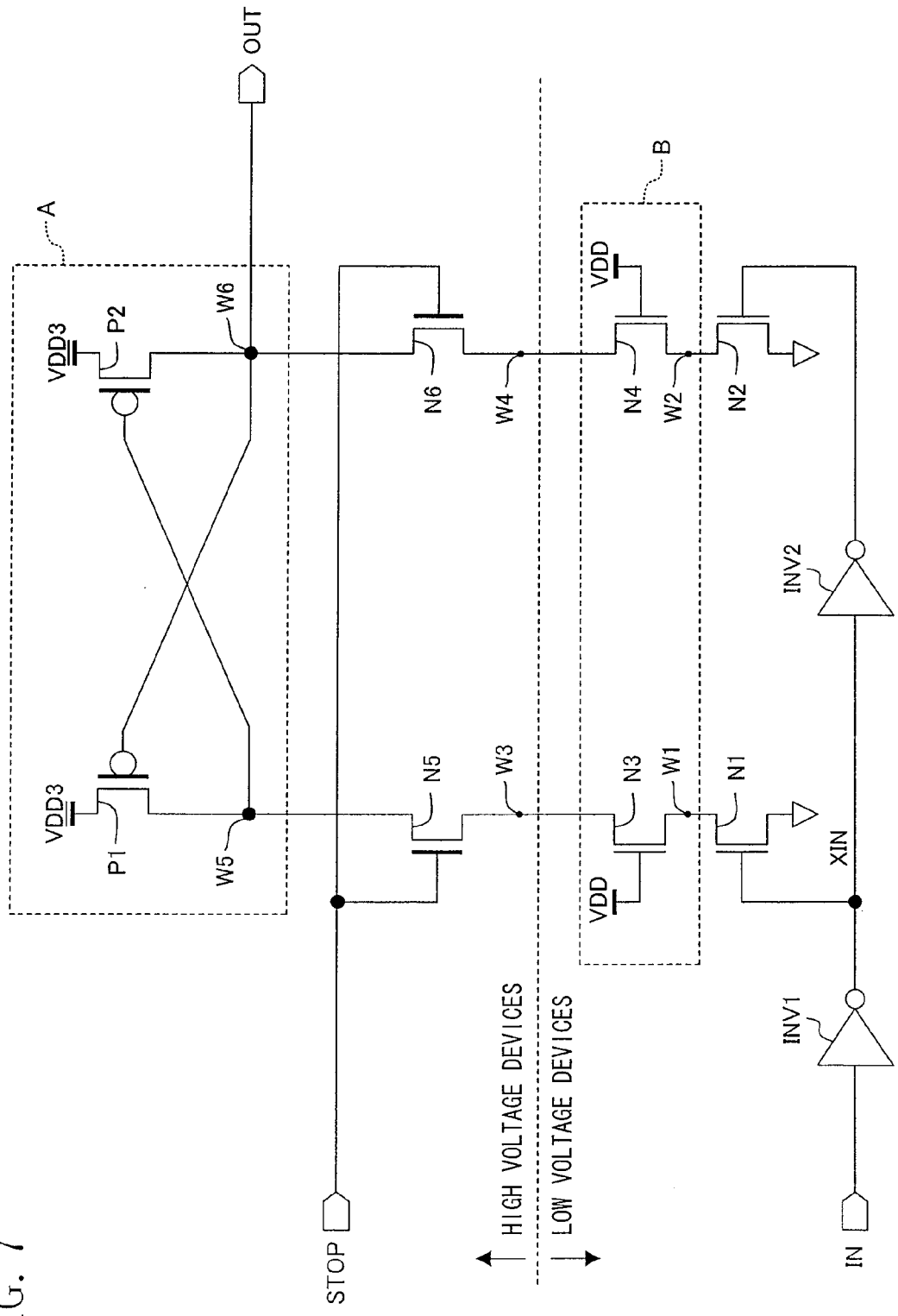
FIG. 7 is a view illustrating the configuration of a level shift circuit in accordance with a third embodiment of the present invention.

FIG. 7 is a view illustrating the specific configuration of a level shift circuit in accordance with this embodiment.

In this embodiment, a stop-mode input signal terminal STOP is added in common to the gates of the N-type high-voltage transistors N5 and N6 of the level shift circuit of the first embodiment shown in FIG. 1.

When a stop-mode signal at the H (1.5 V) level (i.e., at the voltage of a low-voltage supply VDD) is input to the stop-mode input terminal STOP, the level shift circuit of this embodiment operates and functions in the same way as that of the first embodiment. On the other hand, when a stop-mode signal at the L (0 V) level is input to the stop-mode input terminal STOP, N-type high-voltage transistors N5 and N6 are tuned off to stop the level shift circuit, thereby preventing a flow-through current from a high-voltage supply VDD3 into the ground.

As in the second embodiment, instead of connecting the low-voltage supply VDD with the gates of N-type transistors N3 and N4, the diodes shown in FIG. 4, 5, or 6 may be employed as a protection circuit B.

Fourth Embodiment

Figure 8:
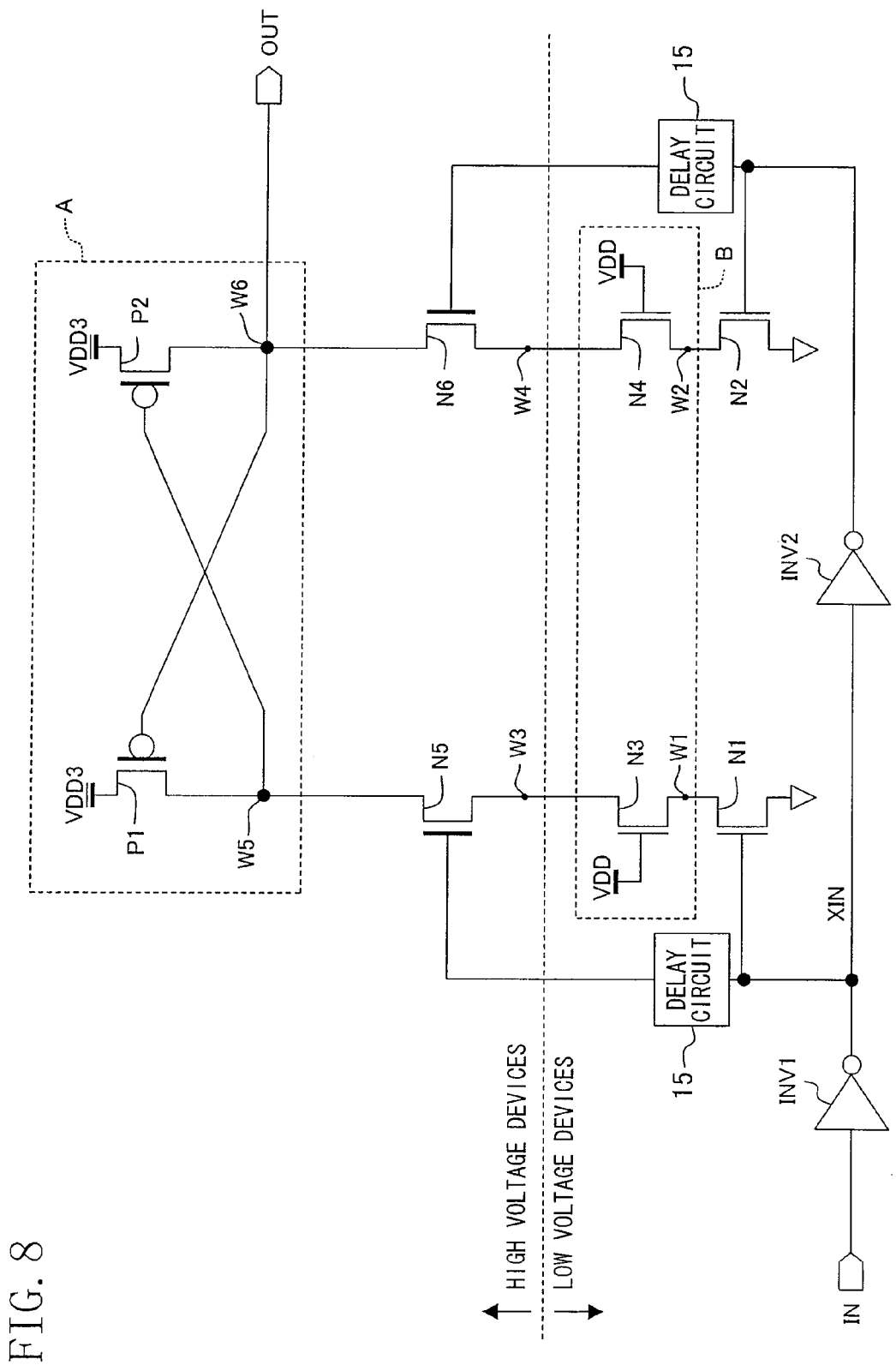
FIG. 8 is a view illustrating the configuration of a level shift circuit in accordance with a fourth embodiment of the present invention.

FIG. 8 is a view illustrating the specific configuration of a level shift circuit in accordance with a fourth embodiment.

The configuration of FIG. 8 differs from that of the level shift circuit of the first embodiment shown in FIG. 1 in that complementary input signals, which are input to the respective gates of N-type signal-receiving transistors N1 and N2, are also respectively input via delay circuits 15 to the gates of N-type high-voltage transistors N5 and N6. In the other respects, the configuration shown in FIG. 8 is the same as that described in the first embodiment.

In this embodiment, when the potential of a signal received at an input terminal IN is at the H (VDD) level, the voltage at the gate of the N-type high-voltage transistor N5 becomes at the L (0 V) level after a predetermined time delay. And the voltage at the gate of the other N-type high-voltage transistor N6 becomes at the H (VDD) level after the predetermined time delay. At this time, the N-type transistor N1 is off, the N-type transistor N2 is on, the N-type transistor N4 is on, the N-type transistor N6 is on, the P-type transistor P1 is on, the P-type transistor P2 is off, the N-type transistor N5 is off, and the N-type transistor N3 is on. A fifth node W5 has the potential (3.3 V) of a high-voltage supply VDD3, while the potential at a sixth node W6 is 0 V. As a result, the voltage at an output terminal OUT is at the L (0 V) level. At this time, a first node W1 has a potential of 0 V, thereby preventing application of a voltage exceeding the voltage of a low-voltage supply VDD between the terminals of the N-type signal-receiving transistor N1.

On the other hand, the potential of the signal received at the input terminal IN is at the L (0 V) level, the voltage at the gate of the N-type high-voltage transistor N5 becomes at the H (VDD) level after the predetermined time delay. And the voltage at the gate of the other N-type high-voltage transistor N6 becomes at the L (0 V) level after the predetermined time delay. At this time, the N-type transistor N1 is on, the N-type transistor N2 is off, the N-type transistor N3 is on, the N-type transistor N5 is on, the P-type transistor P1 is off, the P-type transistor P2 is on, the N-type transistor N6 is off, and the N-type transistor N4 is on. The potential at the fifth node W5 is 0 V, while the sixth node W6 has the potential (3.3 V) of the high-voltage supply VDD3. As a result, the voltage at the output terminal OUT is at the H (3.3 V) level. In this situation, the potential at a second node W2 is 0 V, thereby preventing application of a voltage exceeding the voltage of the low-voltage supply VDD between the terminals of the N-type signal-receiving transistor N2. The other functions are the same as those described in the first embodiment.

As in the second embodiment, instead of connecting the low-voltage supply VDD with the gates of the N-type protection transistors N3 and N4, diodes may be employed as a protection circuit B.

Fifth Embodiment

Figure 9:
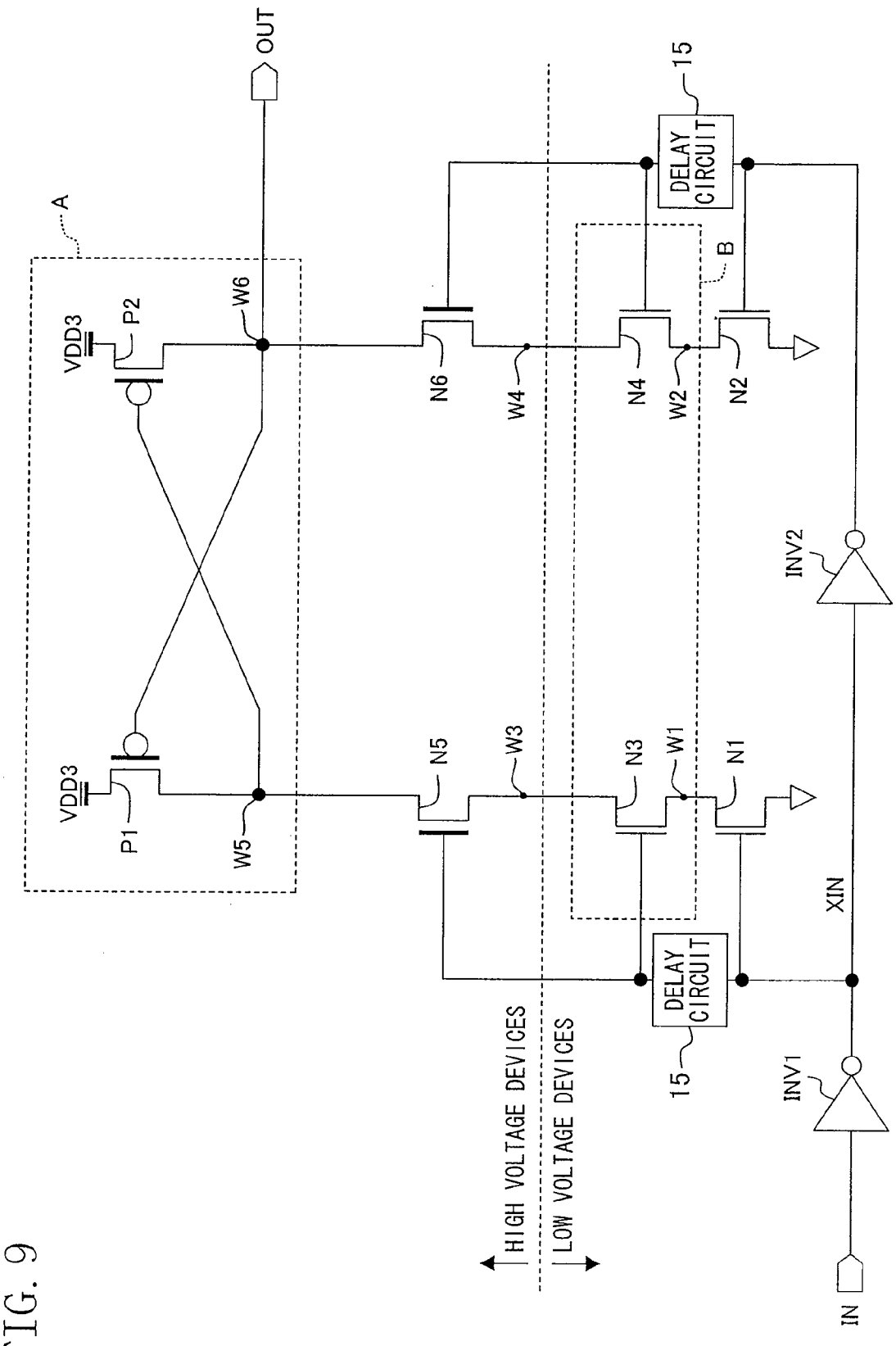
FIG. 9 is a view illustrating the configuration of a level shift circuit in accordance with a fifth embodiment of the present invention.

FIG. 9 is a view illustrating the specific configuration of a level shift circuit in accordance with this embodiment.

The configuration shown in FIG. 9 differs from the level shift circuit of the fourth embodiment shown in FIG. 8 in that output signals respectively produced from delay circuits 15 are also input to the respective gates of N-type protection transistors N3 and N4.

In the level shift circuit of this embodiment, when the potential of a signal received at an input terminal IN is at the H (VDD) level, the voltages at the gates of the N-type protection transistor N3 and N-type high-voltage transistor N5 become at the L (0 V) level after a predetermined time delay. And the voltages at the gates of the N-type protection transistor N4 and N-type high-voltage transistor N6 become at the H (VDD) level after the predetermined time delay. At this time, an N-type transistor N1 is off, an N-type transistor N2 is on, the N-type transistor N4 is on, the N-type transistor N6 is on, a P-type transistor P1 is on, a P-type transistor P2 is off, the N-type transistor N5 is off, and the N-type transistor N3 is off. A fifth node W5 has the potential (3.3 V) of a high-voltage supply VDD3, while the potential at a sixth node W6 is 0 V. As a result, the voltage at an output terminal OUT becomes at the L (0 V) level. At this time, a first node W1 has a potential of 0 V, thereby preventing application of a voltage exceeding the voltage of a low-voltage supply VDD between the terminals of the N-type signal-receiving transistor N1.

On the other hand, the potential at the signal received at the input terminal IN is at the L (0 V) level, the voltages at the gates of the N-type protection transistor N3 and N-type high-voltage transistor N5 become at the H (VDD) level after the predetermined time delay. And the voltages at the gates of the N-type protection transistor N4 and N-type high-voltage transistor N6 become at the L (0 V) level after the predetermined time delay. In this situation, the N-type signal-receiving transistor N1 is on, the N-type transistor N2 is off, the N-type protection transistor N3 is on, the N-type transistor N5 is on, the P-type transistor P1 is off, the P-type transistor P2 is on, the N-type transistor N6 is off, and the N-type transistor N4 is off. The potential at the fifth node W5 is 0 V, while the sixth node W6 has the potential (3.3 V) of the high-voltage supply VDD3. As a result, the voltage at the output terminal OUT is at the H (3.3 V) level. At this time, the potential at a second node W2 is 0 V, thereby preventing application of a voltage exceeding the voltage of the low-voltage supply VDD between the terminals of the N-type signal-receiving transistor N2. The other functions are the same as those described in the first embodiment.

Sixth Embodiment

Figure 10:
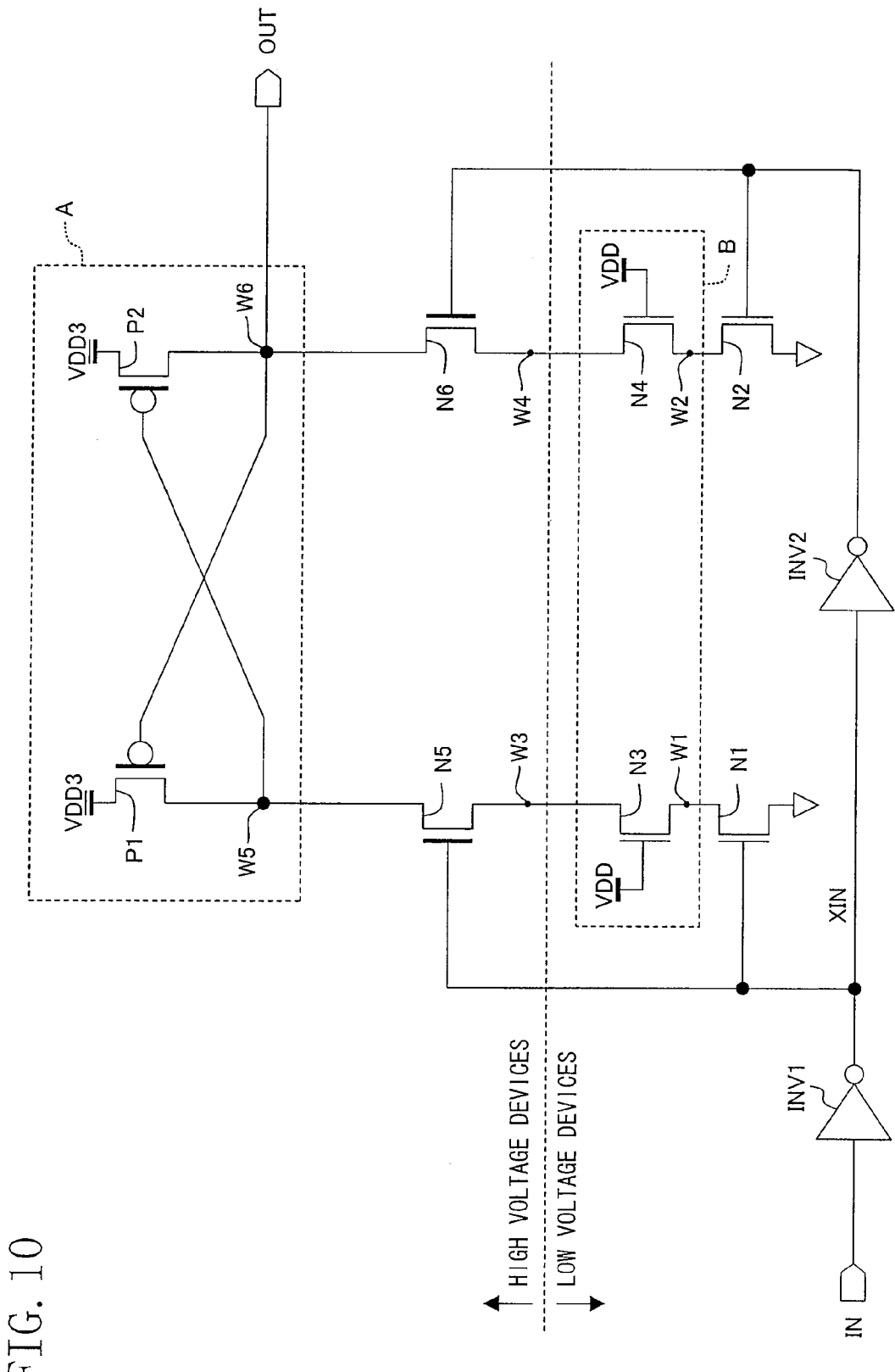
FIG. 10 is a view illustrating the configuration of a level shift circuit in accordance with a sixth embodiment of the present invention.

FIG. 10 is a view illustrating the specific configuration of a level shift circuit in accordance with a sixth embodiment.

The configuration of FIG. 10 differs from the level shift circuit of the first embodiment shown in FIG. 1 in that complementary signals, which are input to the respective gates of N-type signal-receiving transistors N1 and N2, are also input to the respective gates of N-type high-voltage transistors N5 and N6. In the other respects, the configuration of FIG. 10 is the same as that described in the first embodiment.

Operation of the level shift circuit of this embodiment differs from that of the fourth embodiment shown in FIG. 8 as follows. In the fourth embodiment, the N-type high-voltage transistor N5 is turned on or off, when a given amount of time delay has elapsed after the N-type signal-receiving transistor N1 is turned on or off. However, in this embodiment, the N-type signal-receiving transistor N1 and the N-type high-voltage transistor N5 are turned on or off at the same time. Likewise, in this embodiment, the N-type signal-receiving transistor N2 and the N-type high-voltage transistor N6 are turned on or off at the same time, unlike in the fourth embodiment in which the N-type high-voltage transistor N6 is turned on or off, when the given amount of time delay has elapsed after the N-type signal-receiving transistor N2 is turned on or off. In the other respects, the circuit operates and functions in the same manner as that of the fourth embodiment.

As in the second embodiment, instead of connecting a low-voltage supply VDD with the gates of N-type protection transistors N3 and N4, diodes may be employed as a protection circuit B.

Seventh Embodiment

Figure 11:
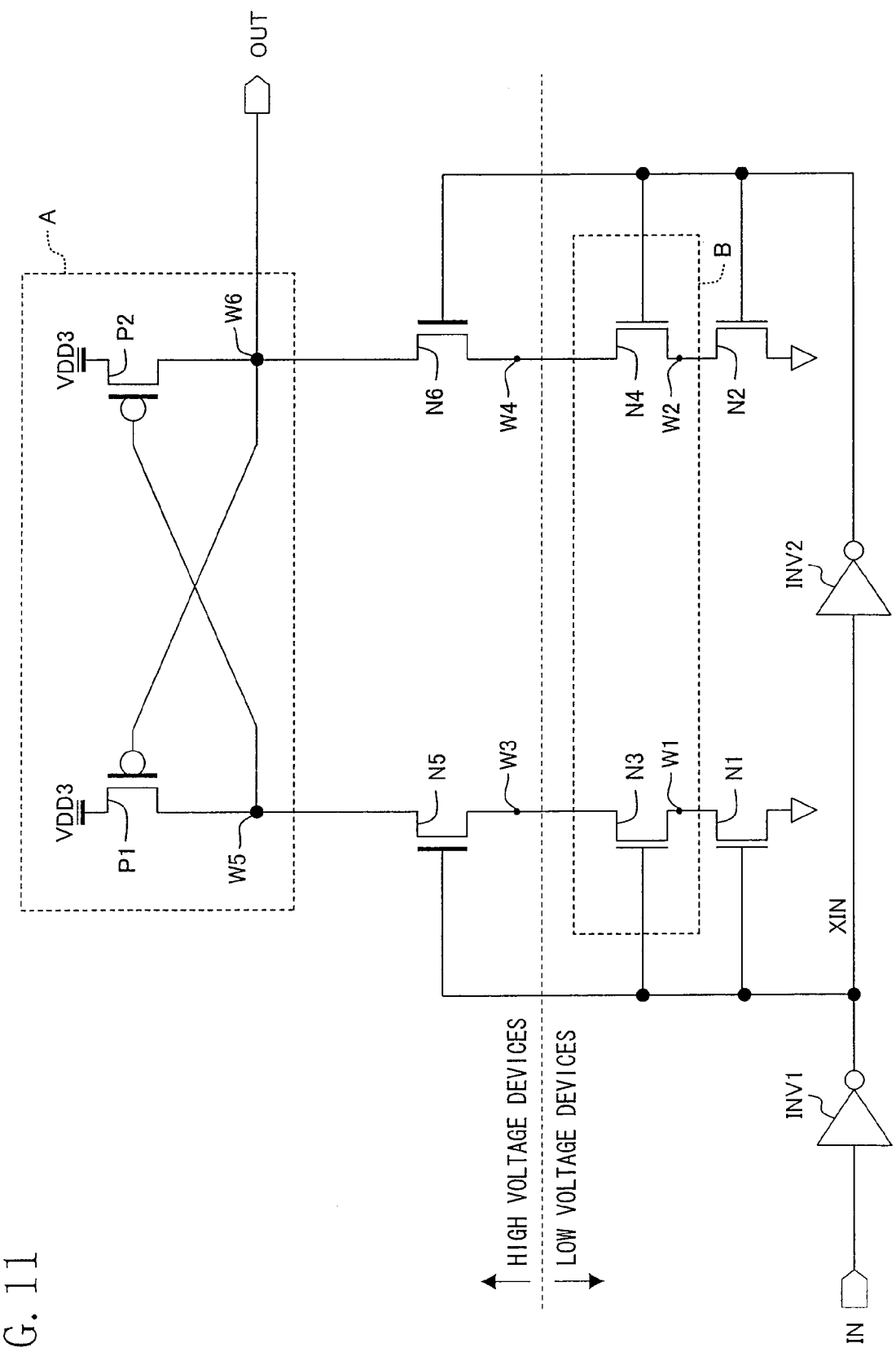
FIG. 11 is a view illustrating the configuration of a level shift circuit in accordance with a seventh embodiment of the present invention.

FIG. 11 is a view illustrating the specific configuration of a level shift circuit in accordance with this embodiment.

The configuration of FIG. 11 differs from the level shift circuit of the sixth embodiment shown in FIG. 10 in that complementary signals, which are input to the respective gates of N-type signal-receiving transistors N1 and N2, are also input to the respective gates of N-type protection transistors N3 and N4.

Operation of the level shift circuit of this embodiment differs from that of the fifth embodiment shown in FIG. 9 as follows. In the fifth embodiment, the N-type protection and high-voltage transistors N3 and N5 are turned on or off, when a given amount of time delay has elapsed after the N-type signal-receiving transistor N1 is turned on or off. However, in this embodiment, the N-type signal-receiving, protection, and high-voltage transistors N1, N3, and N5 are all turned on or off at the same time. Likewise, in the fifth embodiment, the N-type protection and high-voltage transistors N4 and N6 are turned on or off, when the given amount of time delay has elapsed after the N-type signal-receiving transistor N2 is turned on or off. However, in this embodiment, the N-type signal-receiving, protection, and high-voltage transistors N2, N4, and N6 are all turned on or off at the same time. In the other respects, the circuit operates and functions in the same manner as that of the fifth embodiment.

Eighth Embodiment

Figure 12:
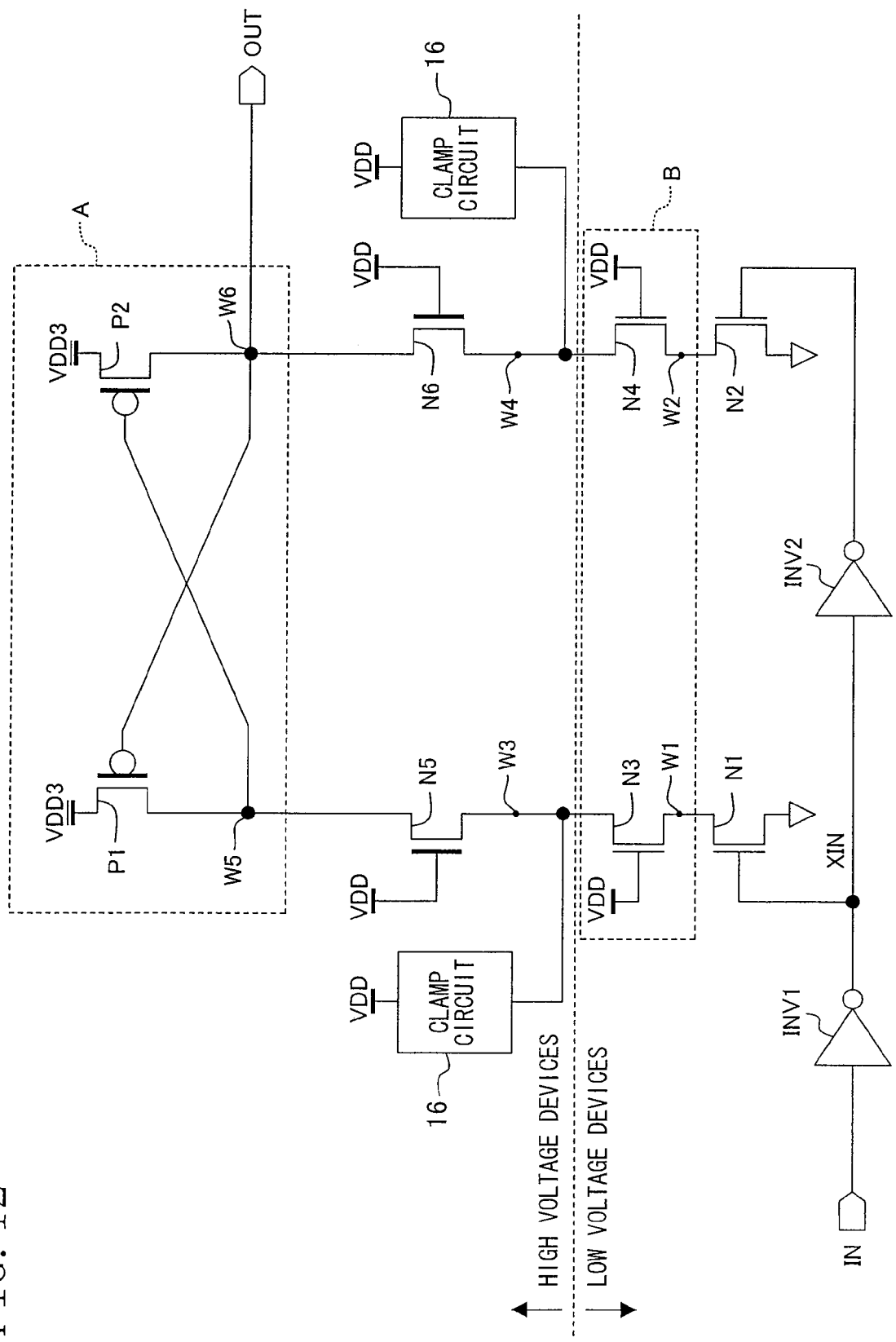
FIG. 12 is a view illustrating the configuration of a level shift circuit in accordance with an eighth embodiment of the present invention.

FIG. 12 is a view illustrating the specific configuration of a level shift circuit in accordance with this embodiment.

The level shift circuit of this embodiment is obtained by adding first and second clamp circuits 16 between the node W3 and the low-voltage supply VDD and between the node W4 and the low-voltage supply VDD, respectively, in the level shift circuit of the first embodiment shown in FIG. 1.

Figure 13A:
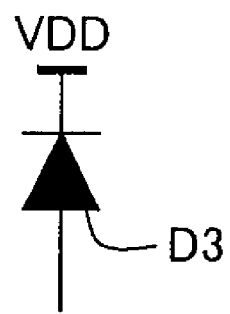
Figure 13B:
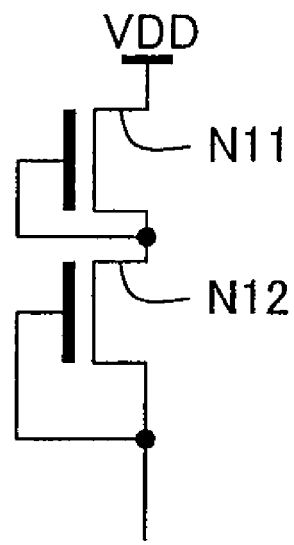
FIG. 13B is a view illustrating an exemplary clamp circuit composed of transistors.
Figure 14:
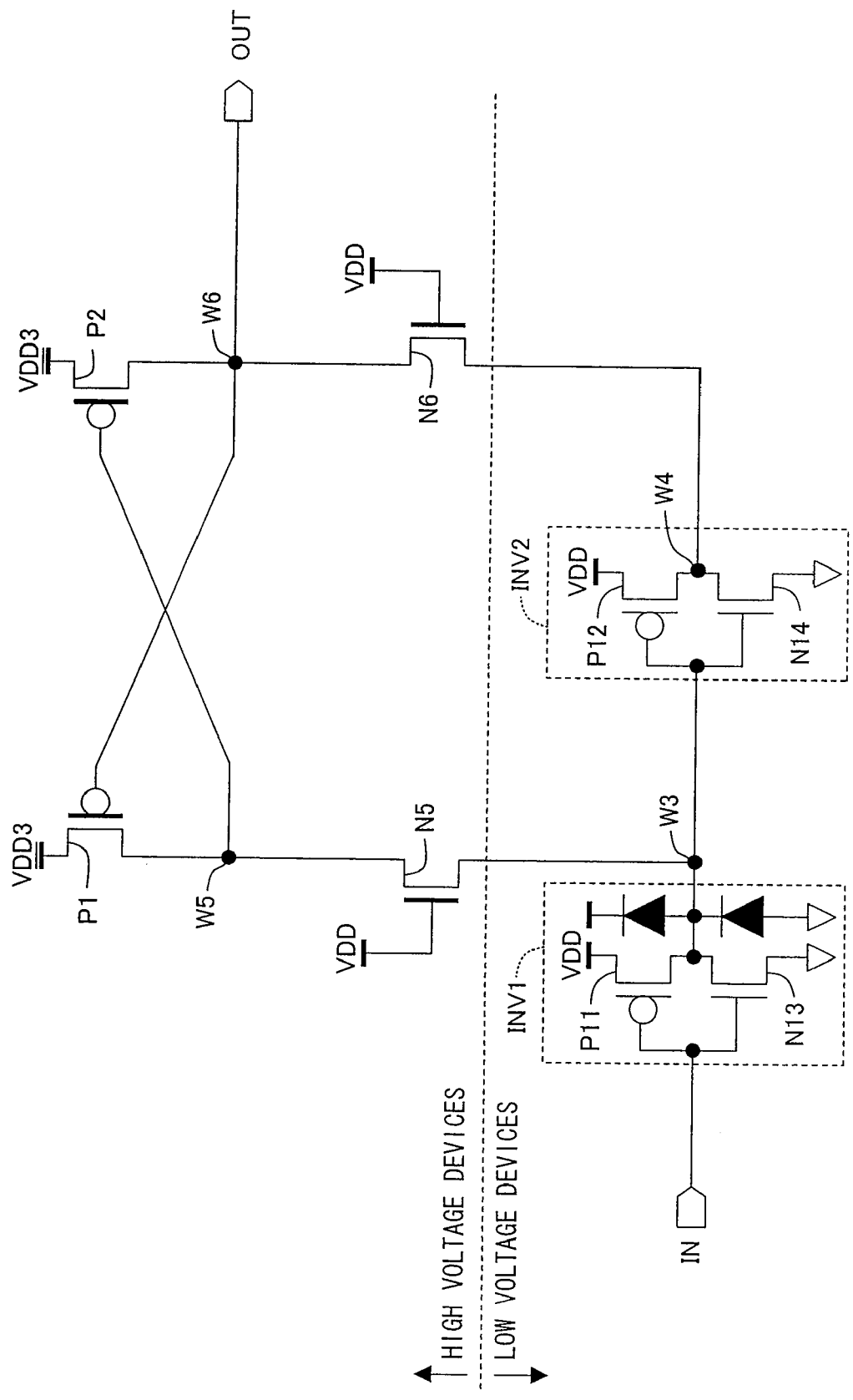
FIG. 14 is a view illustrating the configuration of a conventional level shift circuit.

FIGS. 13A and 13B illustrate examples of the clamp circuit 16. In FIG. 13A, the clamp circuits 16 is composed of a diode D3, while in FIG. 13B, the clamp circuits 16 is composed of one or more transistors (e.g., two N-type transistors N11 and N12 in FIG. 13B.)

The threshold voltage of N-type high-voltage transistors N5 and N6 may vary due to variations in temperature or variations in the fabrication process, which may cause the potentials at the nodes W3 and W4 to increase beyond the voltage of the low-voltage supply VDD. However, in this embodiment, when the potentials at the nodes W3 and W4 increase to exceed the voltage of the low-voltage supply VDD, the clamp circuits 16 permit the charge at the nodes W3 and W4 to escape into the low-voltage supply VDD, thereby preventing application of a voltage exceeding the voltage of the low-voltage supply VDD between the terminals of the N-type protection transistors N3 and N4. In the other respects, the circuit operates and functions in the same manner as that of the first embodiment.

In this embodiment, the clamp circuits 16 are added to the configuration of the level shift circuit of the first embodiment. It will be obvious that the clamp circuits 16 may be added to the level shift circuits of the second through seventh embodiments.

Ninth Embodiment

Figure 15:
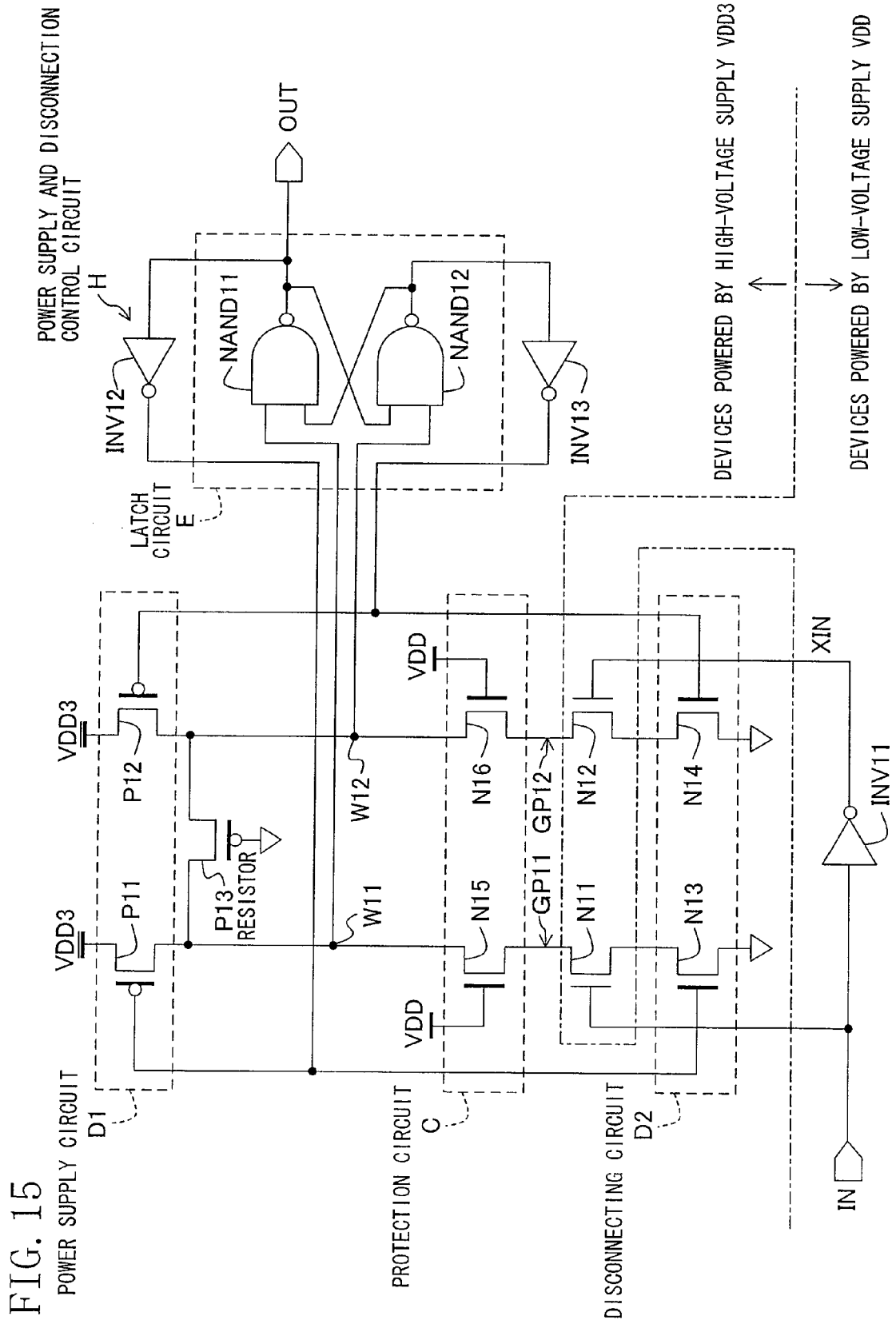
FIG. 15 is a view illustrating the configuration of a level shift circuit in accordance with a ninth embodiment of the present invention.

FIG. 15 is a view illustrating the specific configuration of a level shift circuit in accordance with this embodiment. In FIG. 15, the reference mark IN denotes a signal input terminal, and the reference mark INV11 denotes an inverter for inverting a signal input to the input terminal IN. The input signal to the input terminal IN is powered by a low-voltage supply VDD, which supplies a low voltage of 1.5 V, for example.

In FIG. 15, the reference marks N11 and N12 denote N-type low-voltage transistors which receive a pair of complementary first and second signals. The signal IN (which is one of the first and second signals serving as the complementary signals) input to the input terminal IN is input to the gate of the N-type transistor N11. An inverted signal XIN (which is the other of the first and second signals serving as the complementary signals) produced from the inverter INV11 is input to the gate of the other N-type transistor N12.

In the level shift circuit shown in FIG. 15, the inverter circuit INV11, and the two N-type complementary-signal-receiving transistors N11 and N12 are low-voltage devices that operate powered by the low-voltage supply VDD. All of the other devices, which will be described below, are high-voltage devices that operate at a high voltage of 3.3 V, for example, supplied from a high-voltage supply VDD3.

In the level shift circuit of FIG. 15, the reference mark D1 denotes a power supply circuit composed of a pair of P-type transistors P11 and P12. The P-type transistor P11 is connected at its source to the high-voltage supply VDD3 and at its drain to a first node W11. The other P-type transistor P12 is connected at its source to the high-voltage supply VDD3 and at its drain to a second node W12. When either the P-type transistor P11 or P12 is on, the power supply circuit D1 supplies the voltage of the high-voltage supply VDD3 to the first or second node W11 or W12 by way of the P-type transistor P11 or P12 that is in the on state. The drains of the two P-type transistors P11 and P12, that is, the first and second nodes W11 and W12, are connected with each other by a P-type transistor P13 (i.e., a resistor) functioning as a resistor. The P-type transistor P13 is grounded at its gate.

Moreover, the reference mark E denotes a latch circuit composed of first and second two-input NAND circuits NAND11 and NAND12. The first NAND circuit NAND11 receives a signal from the first node W11 and an output signal from the second NAND circuit NAND12, while the second NAND circuit NAND12 receives a signal from the second node W12 and an output signal from the first NAND circuit NAND11, such that the first and second two-input NAND circuits NAND11 and NAND12 retain the respective potentials at the first and second nodes W11 and W12. The first NAND circuit NAND11 is connected at its output side to an output terminal OUT.

A disconnecting circuit D2 is provided in two ground paths GP11 and GP12, going from the respective first and second nodes W11 and W12 via the respective two N-type complementary-signal-receiving transistors N11 and N12 to the ground, and is interposed between the two N-type complementary-signal-receiving transistors N11 and N12 and the ground. The disconnecting circuit D2 is composed of two N-type transistors N13 and N14. The N-type transistor N13 is grounded at its source and connected at its drain to the N-type complementary-signal-receiving transistor N11. The other N-type transistor N14 is grounded at its source and connected at its drain to the other N-type complementary-signal-receiving transistor N12.

In addition, in the level shift circuit shown in FIG. 15, the first and second NAND circuits NAND11 and NAND12 of the latch circuit E are connected at their respective output sides to inverter circuits INV12 and INV13. The inverter circuits INV12 and INV13 form a power supply and disconnection control circuit H or controlling the power supply circuit D1 and the disconnecting circuit D2. The inverter circuit INV12 receives the output signal of the first NAND circuit NAND11 and outputs the inverted version of the received signal to the gate of the P-type transistor P11 of the power supply circuit D1 and to the gate of the N-type transistor N13 of the disconnecting circuit D2. Similarly, the other inverter circuit INV13 receives the output signal of the second NAND circuit NAND12 and outputs the inverted version of the received signal to the gate of the P-type transistor P12 of the power supply circuit D1 and to the gate of the N-type transistor N14 of the disconnecting circuit D2.

The level shift circuit of this embodiment shown in FIG. 15 is characterized in that a protection circuit C is disposed between the first node W11 and the drain of the N-type complementary-signal-receiving transistor N11 and between the second node W12 and the drain of the N-type complementary-signal-receiving transistor N12. The protection circuit C protects the N-type complementary-signal-receiving transistors N11 and N12. The protection circuit C is composed of two N-type transistors N15 and N16. The N-type transistor N15 is connected at its source to the drain of the N-type complementary-signal-receiving transistor N11 and at its drain to the first node W11. The other N-type transistor N16 is connected at its source to the drain of the other N-type complementary-signal-receiving transistor N12 and at its drain to the second node W12. The respective gates of the two N-type transistors N15 and N16 are connected to the low-voltage supply VDD. The threshold voltage of the N-type high-voltage transistors N15 and N16 that form the protection circuit C is set to a low voltage of about 0 V, for example.

Hereinafter, it will be described how the level shift circuit having the above-mentioned configuration operates.

In a steady state, the potentials at the first and second nodes W11 and W12 are both at the H (i.e., VDD3) level. When an input signal is at the L (i.e., 0 V) level, the N-type complementary-signal-receiving transistors N11 and N12 are off and on, respectively, and the respective outputs of the first and second NAND circuits NAND11 and NAND12 of the latch circuit E are at the L (i.e., 0 V) level and at the H (i.e., VDD3) level, respectively, such that the first and second NAND circuits NAND11 and NAND12 retain the logic of the respective levels. At this time, the P-type transistors P11 and P12 of the power supply circuit D1 are off and on, respectively, and the N-type transistors N13 and N14 of the disconnecting circuit D2 are on and off, respectively. The source voltages of the N-type transistors N15 and N16 of the protection circuit C, that is, the drain voltages of the N-type complementary-signal-receiving transistors N11 and N12, are restricted to not more than the power supply voltage of the low-voltage supply VDD (i.e., to not more than the withstand voltage of the N-type transistors N11 and N12.) Thus, the voltage of the high-voltage supply VDD3 at the first and second nodes W11 and W12 is not applied between the terminals of the N-type complementary-signal-receiving transistors N11 and N12. Accordingly, voltage exceeding the power supply voltage of the low-voltage supply VDD is not applied between the terminals of the N-type complementary-signal-receiving transistor N11, thereby preventing the breakdown of the N-type complementary-signal-receiving transistor N11. Since the output of the NAND circuit NAND11 is at the L (i.e., 0 V) level, the voltage at the output terminal OUT is at the L (i.e., 0 V) level.

In the above-described state, if the input signal IN changes from the L (i.e., 0 V) level to the H (i.e., VDD) level, the N-type complementary-signal-receiving transistor N11 turns on, while the other N-type transistor N12 turns off. At this time, the N-type transistor N13 of the disconnecting circuit D2 is on, such that the drain of the N-type complementary-signal-receiving transistor N11 is grounded by way of the N-type transistor N13 of the disconnecting circuit D2, which causes the N-type transistor 15 of the protection circuit C to turn on. Consequently, the ground path GP11 is connected to the ground, whereby the potential at the first node W11 changes from the H (i.e., VDD3) level to the L (i.e., 0 V) level, which causes the logic of the latch circuit E to be inverted to the opposite. As a result, the output of the NAND circuit NAND11 is inverted to the H (i.e., VDD3) level, while the output of the NAND circuit NAND12 is inverted to the L (i.e., 0 V) level. Then, the N-type transistor N13 of the disconnecting circuit D2 turns off to block the ground path GP11, while the P-type transistor P11 of the power supply circuit D1 turns on, thereby allowing the high-voltage supply VDD3 to precharge the first node W11 to the H (i.e., VDD3) level. On the other hand, the P-type transistor P12 of the power supply circuit D1 turns off to stop precharging of the second node W12 by the high-voltage supply VDD3, while the N-type transistor N14 of the disconnecting circuit D2 turns on, so that the level shift circuit enters a waiting state in which the level shift circuit waits for the next input signal change. Since the output of the NAND circuit NAND11 is at the H (i.e., VDD3) level, the voltage at the output terminal OUT is at the H (i.e., VDD3) level. The level shift circuit shown in FIG. 15, operating in the above-described manner, outputs the signal obtained by changing the logical level of the input signal powered by the low-voltage supply VDD to the high-voltage supply VDD3 level.

The two N-type transistors N11 and N12, which receive the complimentary signals at their respective gates, are composed of low-voltage transistors whose threshold voltage is low. Therefore, the N-type low-voltage transistors N11 and N12 operate as intended, even if the power supply voltage of the low-voltage supply VDD for the complimentary signals is set lower. As a result, the level shift circuit of FIG. 15 performs level shift operation reliably.

In addition, when the N-type complementary-signal-receiving transistor N11 turns on to connect the ground path GP11 to the ground, the potential at the first node W11 is at the H (i.e., VDD3) level. However, the N-type transistor N15 of the protection circuit C is connected at its gate to the low-voltage supply VDD. Therefore, the N-type transistor N15 of the protection circuit C restricts the drain voltage of the N-type complementary-signal-receiving transistor N11 to not more than the power supply voltage of the low-voltage supply VDD. Accordingly, voltage exceeding the power supply voltage of the low-voltage supply VDD (i.e., voltage exceeding the withstand voltage of the N-type transistor N11) is not applied between the terminals of the N-type complementary-signal-receiving transistor N11, thereby preventing the breakdown of the N-type complementary-signal-receiving transistor N11.

Also, since the threshold voltage of the N-type high-voltage transistors N15 and N16 forming the protection circuit C is set to a low voltage close to 0 V, for example, the two N-type high-voltage transistors N15 and N16 of the protection circuit C operate properly, even if the voltage of the low-voltage supply VDD is set low. As a result, the level shift circuit of FIG. 15 operates reliably.

In a case where the input signal IN changes in the opposite direction to that of the above-described case, that is, from the H (i.e., VDD3) level to the L (i.e., 0 V) level, the level shift circuit also operates in the above-described manner and description thereof will be thus omitted herein.

Tenth Embodiment

Figure 16:
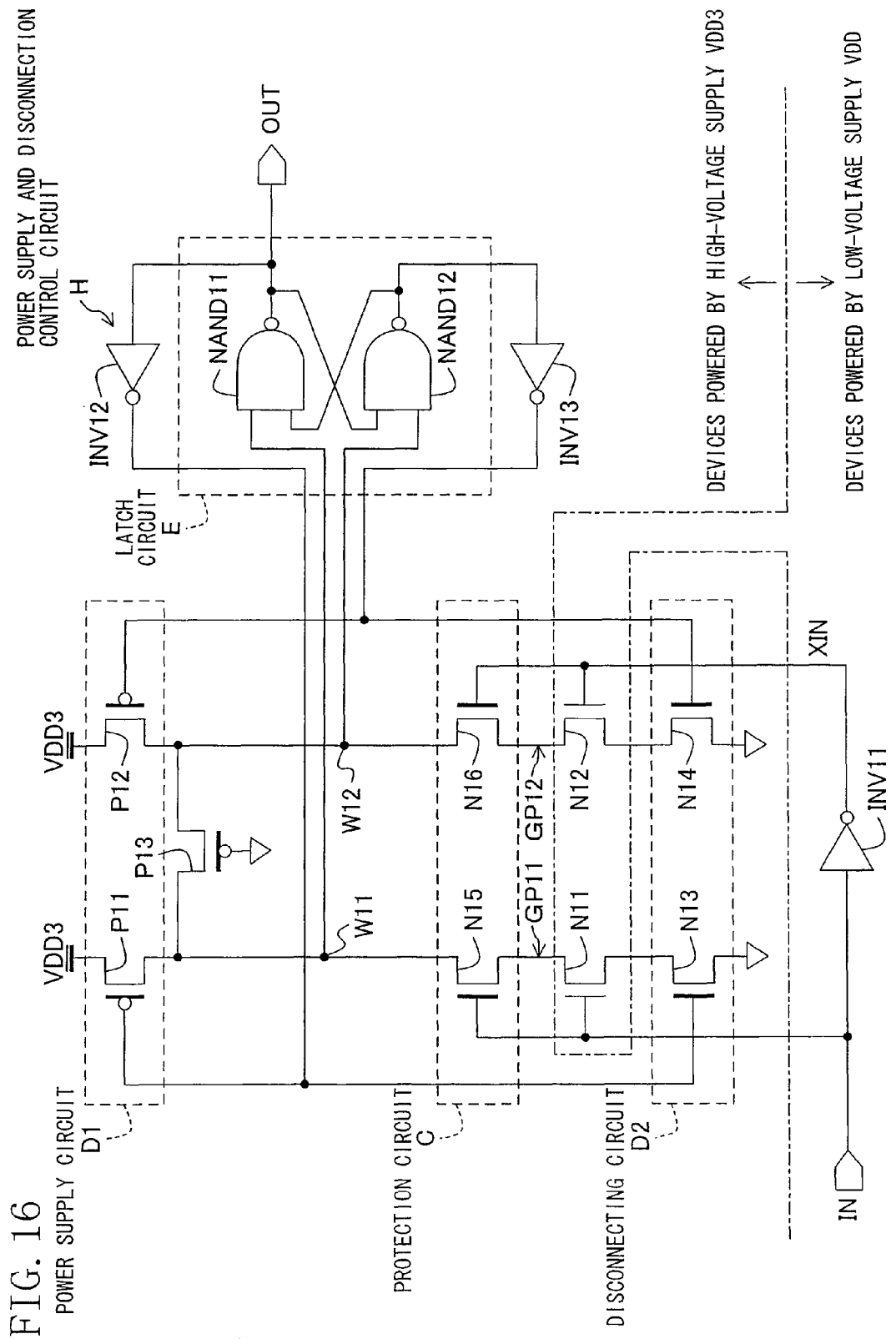
FIG. 16 is a view illustrating the configuration of a level shift circuit in accordance with a tenth embodiment of the present invention.

FIG. 16 is a view illustrating the specific configuration of a level shift circuit in accordance with a tenth embodiment of the present invention.

As shown in FIG. 15, in the level shift circuit of the ninth embodiment, the respective gates of the two N-type transistors N15 and N16 forming the protection circuit C are connected to the low-voltage supply VDD. In this embodiment, an input signal IN and a signal XIN, which is the inverted version of the input signal IN produced from an inverter circuit INV11, are respectively input to the gates of N-type transistors N15 and N16. In the other respects, the configuration of the level shift circuit of this embodiment is the same as that shown in FIG. 15 and description thereof will be thus omitted herein.

Therefore, in this embodiment as in the ninth embodiment, when the input signal IN changes from the L (i.e., 0 V) level to the H (i.e., VDD) level, for example, an N-type complementary-signal-receiving transistor N11 turns on, so that the potential at a first node W11 decreases from the H (i.e., VDD3) level because the charge of the first node W11 flows through a ground path GP11. At this time, the H-level potential (i.e., the power supply voltage of a low-voltage supply VDD) of the input signal IN is applied to the gate of the N-type transistor N15 of the protection circuit C, which allows the N-type transistor N15 of the protection circuit C to restrict the drain potential of the N-type complementary-signal-receiving transistor N11 to not more than the voltage of the low-voltage supply VDD (i.e., to not more than the withstand voltage of the N-type transistor N11), thereby preventing the breakdown of the N-type complementary-signal-receiving transistor N11. Although the other N-type complementary-signal-receiving transistor N12 turns off, a voltage at the L level (i.e., 0 V) is applied to the gate of the other N-type transistor N16 of the protection circuit C. Therefore, even if a second node W12 has the voltage of the high-voltage supply VDD3, the high voltage of the high-voltage supply VDD3 is not applied to the drain of the N-type complementary-signal-receiving transistor N12.

This holds true in a case where the input signal IN changes from the H (i.e., VDD3) level to the L level (i.e., 0 V).

Eleventh Embodiment

Figure 17:
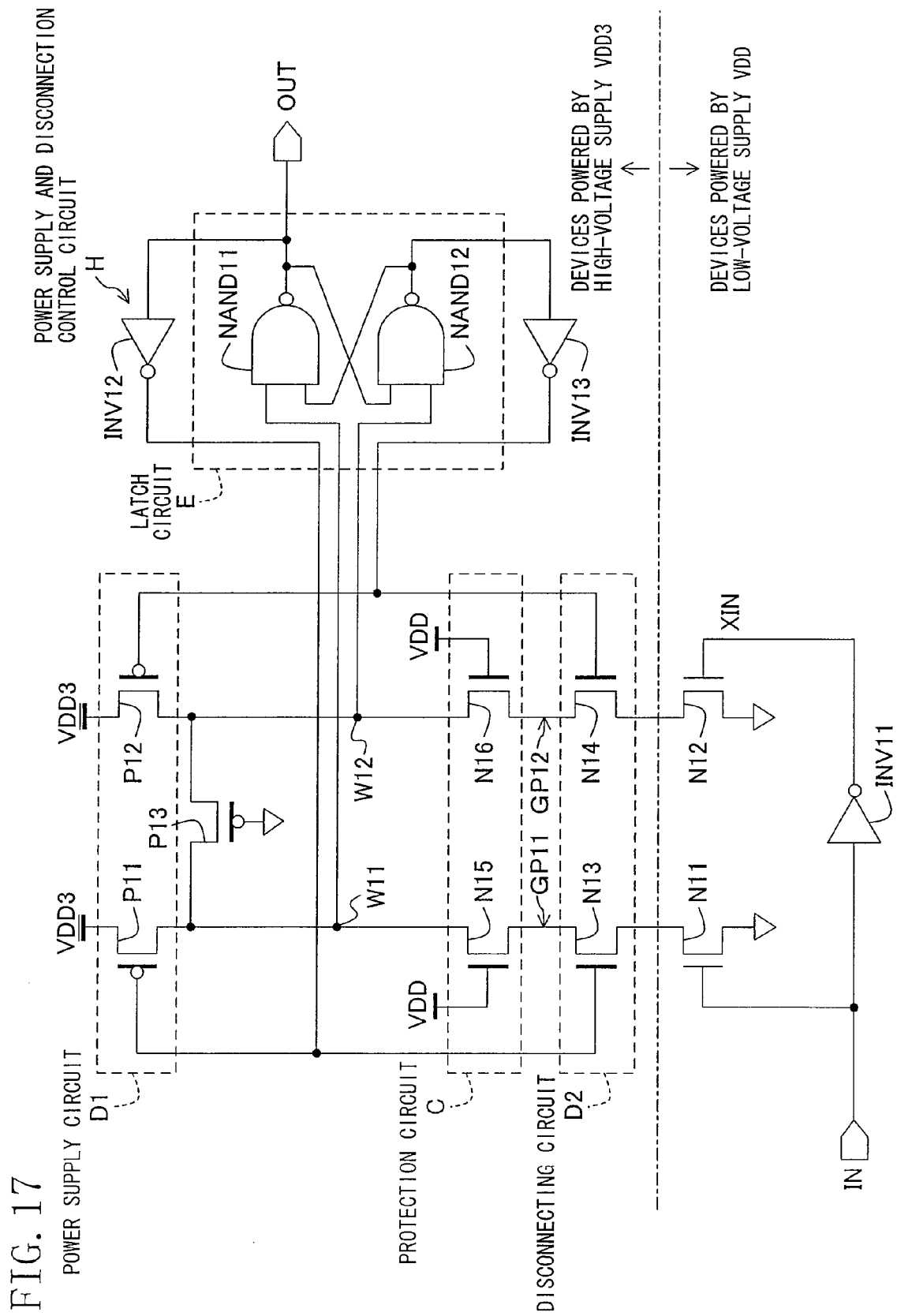
FIG. 17 is a view illustrating the configuration of a level shift circuit in accordance with an eleventh embodiment of the present invention.

FIG. 17 is a view illustrating the specific configuration of a level shift circuit in accordance with an eleventh embodiment of the present invention.

Comparing the level shift circuit shown in FIG. 17 and the level shift circuit shown in FIG. 15, the positions in which two N-type complementary-signal-receiving transistors N11 and N12 are placed and the positions in which two N-type transistors N13 and N14 forming a disconnecting circuit D2 are placed are replaced each other. More specifically, in the configuration of FIG. 17, a protection circuit C and a disconnecting circuit D2 are disposed between two N-type complementary-signal-receiving transistors N11 and N12 and first and second nodes W11 and W12. In the other respects, the configuration of this embodiment is the same as that described in the ninth embodiment.

Therefore, in the level shift circuit of this embodiment, N-type transistors N13 and N14 forming the disconnecting circuit D2 and two N-type transistors N15 and N16 of the protection circuit C restrict the drain potentials of the two N-type complementary-signal-receiving transistors N11 and N12 to a potential less than the potential of a low-voltage supply VDD (i.e., to a potential not exceeding the withstand voltage of the two N-type transistor N11 and N12.)

It should be noted that protection circuits C1 through C7 shown in FIGS. 18A through 18G may be employed as modified examples of the protection circuits C described in the foregoing first through tenth embodiments. For example, in the protection circuit C1 shown in FIG. 18A, devices disposed in ground paths GP11 and GP12 are series circuits, in each of which an N-type high-voltage transistor N51 and an N-type low-voltage transistor N52 are connected. The threshold voltage of the N-type high-voltage transistors N51 is 0 V, for example, while the threshold voltage of the N-type low-voltage transistors N52 is 0.3 V, for example. Therefore, in the fabrication process of the N-type high-voltage transistors N51, even if their threshold voltage does not become 0 V but a negative value (e.g., −0.1 V), the voltage applied to the sources of the N-type low-voltage transistors N52 (i.e., the drains of the N-type complementary-signal-receiving transistors N11 and N12) is restricted to the voltage (i.e., VDD−0.3 V) that is lower than the voltage of the low-voltage supply VDD by their threshold voltage. Also, in FIG. 18E, the N-type low-voltage transistors N52 of the FIG. 18A are replaced with diodes D11. Moreover, as shown in FIG. 18G, if the sources of two N-type high-voltage transistors N51 are connected to the low-voltage supply VDD by way of a clamp circuit D12 composed of a diode, the source voltages of the N-type high-voltage transistors N51 are restricted to the voltage of the low-voltage supply VDD, whereby N-type low-voltage transistors N52 are protected in an excellent manner. The signals IN and XIN, which are input to the gates of the N-type complementary-signal-receiving transistors N11 and N12 connected in series to the N-type transistors N51 and N52, are input to the respective gates of the N-type transistors N51 or N52 shown in FIGS. 18B through 18D and in FIG. 18F. The diodes D11 and D12 shown in FIGS. 18E through 18G may be replaced with N-type and P-type transistors. Although in FIG. 18G, the clamp circuit D12 is added to the protection circuit C1 shown in FIG. 18A, it will be obvious that the clamp circuit D12 may be added to the protection circuits C2 through C6 shown in FIGS. 18B through 18F.

Twelfth Embodiment

FIG. 19 is a view illustrating the specific configuration of a level shift circuit in accordance with a twelfth embodiment of the present invention.

In the level shift circuit of the eleventh embodiment shown in FIG. 17, the disconnecting circuit D2 and the protection circuit C are provided. However, in this embodiment, the two N-type transistors N13 and N14 forming the disconnecting circuit D2 shown in FIG. 17 are also used as the two N-type transistors N15 and N16 forming the protection circuit C of FIG. 17, so that the two N-type transistors N13 and N14 form a disconnecting circuit/protection circuit G.

In the disconnecting circuit/protection circuit G, the N-type transistors N13 and N14 are composed of high-voltage devices that operate at a high voltage of 3.3 V, for example, supplied from a high-voltage supply VDD3. The threshold voltage of these N-type high-voltage transistors N13 and N14 is set to a low voltage of about 0 V, for example.

The N-type transistors N13 and N14 in the disconnecting circuit/protection circuit G are connected at their respective gates to first and second level shifters (i.e., lowering circuits) LD11 and LD12. These level shifters LD11 and LD12, which are composed of high-voltage devices that operate powered by the high-voltage supply VDD3, respectively receive outputs from two inverter circuits INV12 and INV13 that are connected to a latch circuit E. The level shifters LD11 and LD12 and the inverter circuits INV12 and INV13 function as an interception control circuit F for controlling the disconnecting circuit portion of the disconnecting circuit/protection circuit G. More specifically, the first level shifter LD11 receives the output signal of the inverter circuit INV12, changes the logical level of the received signal to a low-voltage supply VDD level, and outputs the resultant signal to the gate of the N-type transistor N13 of the disconnecting circuit/protection circuit G. Likewise, the second level shifter LD12 receives the output signal of the inverter circuit INV13, changes the logical level of the received signal to the low-voltage supply VDD level, and outputs the resultant signal to the gate of the other N-type transistor N14 of the disconnecting circuit/protection circuit G.

In the level shift circuit configured in the above-described manner, the disconnecting circuit/protection circuit G restricts the drain potentials of N-type complementary-signal-receiving transistors N11 and N12 to a low potential less than the potential of the low-voltage supply VDD (i.e., to a potential not exceeding the withstand voltage of the two N-type transistors N11 and N12), thereby preventing the breakdown of the N-type complementary-signal-receiving transistors N11 and N12.

Furthermore, the threshold voltage of the N-type high-voltage transistors N13 and N14 forming the disconnecting circuit/protection circuit G is set to a low voltage of about 0 V, for example. Therefore, the level shift circuit of FIG. 19 operates reliably, even if the voltage of the low-voltage supply VDD is set low.

Moreover, since only the two N-type transistors N13 and N14 function as the protection circuit and as the disconnecting circuit, the circuit area can be reduced as compared with the ninth and tenth embodiments.

Thirteenth Embodiment

Figure 20:
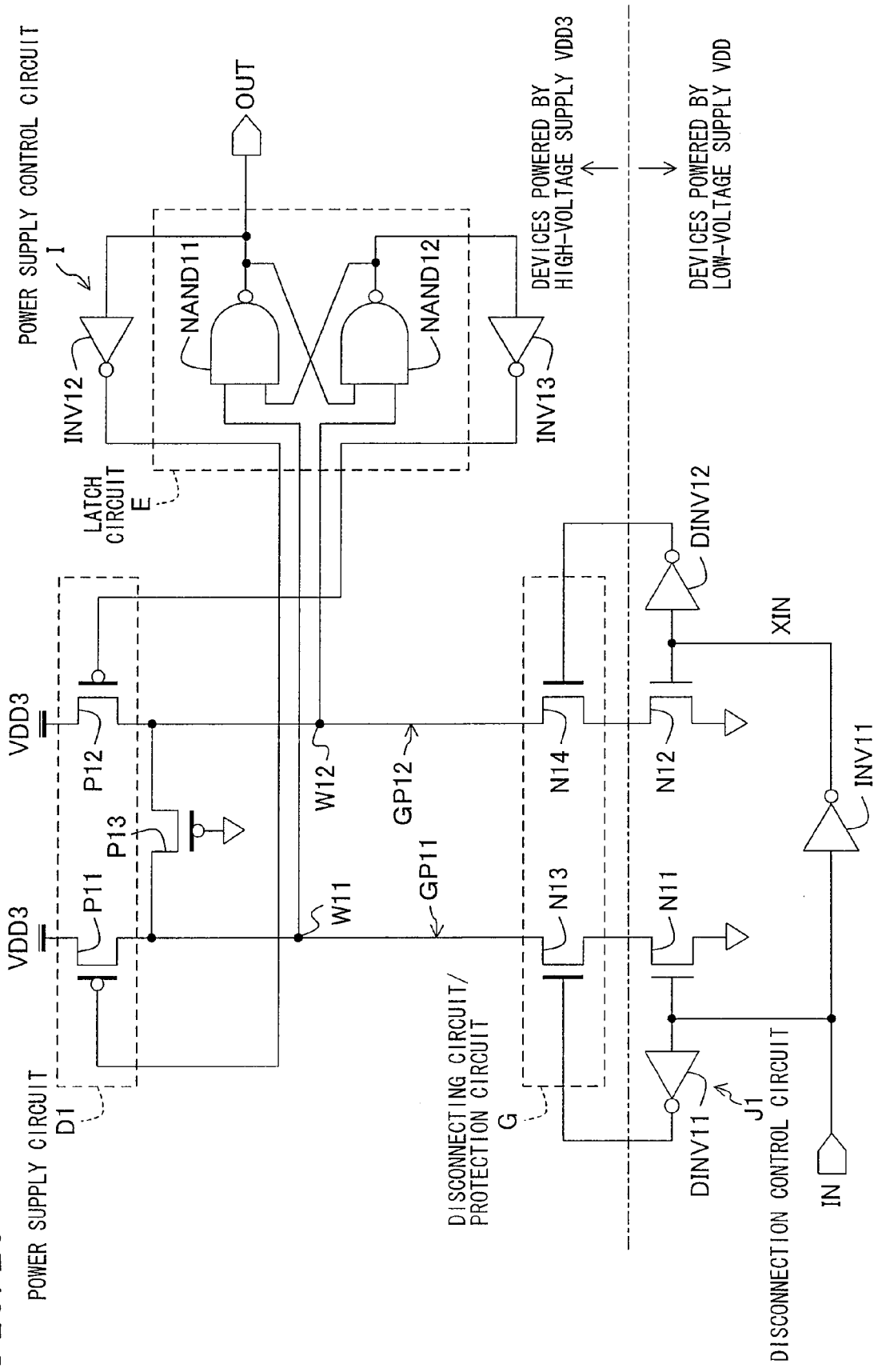
FIG. 20 is a view illustrating the configuration of a level shift circuit in accordance with a thirteenth embodiment of the present invention.

FIG. 20 is a view illustrating the specific configuration of a level shift circuit in accordance with a thirteenth embodiment of the present invention.

The level shift circuit of this embodiment differs from that shown in FIG. 19 in the following respects. In the level shift circuit shown in FIG. 19, the level shifters LD11 and LD12 are provided to lower the voltage level of the signals produced from the inverter circuits INV12 and INV13 to the voltage level of the low-voltage supply VDD, and the signals at the voltage level of the low-voltage supply VDD are supplied to the N-type transistors N13 and N14 of the disconnecting circuit/protection circuit G. However, in this embodiment, an input signal IN and its inverted signal XIN powered by a low-voltage supply VDD are respectively supplied to N-type transistors N13 and N14 of a disconnecting circuit/protection circuit G via delay circuits DINV11 and DINV12 composed of inverter circuits, respectively.

The delay circuits DINV11 and DINV12 function as a disconnection control circuit J1 for controlling the disconnecting circuit portion of the disconnecting circuit/protection circuit G. The delay circuits DINV11 and DINV12 are composed of low-voltage devices which operate at a low voltage of 1.5 V, for example, supplied from the low-voltage supply VDD. Since the disconnection control circuit J1 is provided, two inverter circuits INV12 and INV13 do not have any disconnection control function and serve as a power supply control circuit I for controlling only a power supply circuit D1.

Accordingly, in the level shift circuit of this embodiment, when the input signal changes from the L (i.e., 0 V) level to the H (i.e., VDD) level, an N-type complementary-signal-receiving transistor N11 turns on. At this time, the N-type transistor N13 of the disconnecting circuit/protection circuit G is on until a given amount of delay time of the delay circuit DINV11 has elapsed. Thus, a ground path GP11 is connected to the ground, causing the potential at a first node W11 to change from the H (i.e., VDD3) level to the L (i.e., 0 V) level. At this time, the N-type transistor N13 of the disconnecting circuit/protection circuit G, having the gate potential at the H (i.e., VDD) level, restricts its source potential, that is, the drain potential of the N-type complementary-signal-receiving transistor N11 to not more than the voltage of the low-voltage supply VDD (i.e., to not more than the withstand voltage of the N-type transistor N11.) This prevents the breakdown of the N-type complementary-signal-receiving transistor N11.

With this level shift of the potential at the first node W11 to the L (i.e., 0 V) level, a NAND circuit NAND12 of a latch circuit E goes to the L (i.e., 0 V) level, causing the inverter circuit INV13 to produce an output signal for turning off a P-type transistor P12 of the power supply circuit D1. Consequently, precharging of a second node W12 is stopped, and when the given amount of delay time of the delay circuit DINV12 has elapsed, the gate potential of the other N-type complementary-signal-receiving transistor N14 is put to the H (i.e., VDD) level, causing the N-type transistor N14 to turn on. As a result, the level shift circuit enters a waiting state in which the level shift circuit waits for the next input signal.

Fourteenth Embodiment

FIG. 21 is a view illustrating the specific configuration of a level shift circuit in accordance with a fourteenth embodiment of the present invention.

The level shift circuit of this embodiment differs from that shown in FIG. 20 in the following respect. In this embodiment, input signals are input to the gates of N-type transistors N13 and N14 of a disconnecting circuit/protection circuit G in a different way from that shown in FIG. 20. Specifically, the input signal IN is input to the N-type transistor N14 of the disconnecting circuit/protection circuit G by way of a delay circuit DL11, while the inverted signal XIN of the input signal IN is input to the N-type transistor N13 of the disconnecting circuit/protection circuit G by way of another delay circuit DL12. These two delay circuits DL11 and DL12 form a disconnection control circuit J2 and are composed of low-voltage devices that operate at a low voltage of 1.5 V, for example, supplied from a low-voltage supply VDD.

The level shift circuit of this embodiment operates in the same manner as that of the thirteenth embodiment, and description thereof will be thus omitted herein.

Figure 22C:
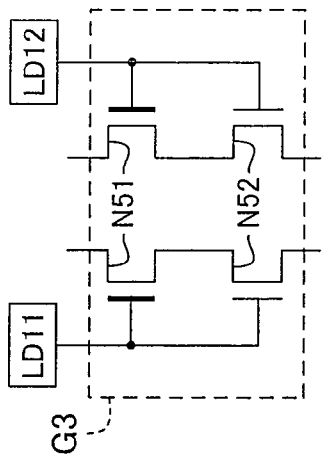
FIGS. 22A through 22E are views illustrating modified examples of a protection circuit employed in the level shift circuits of the twelfth through fourteenth embodiments of the present invention.
Figure 22B:
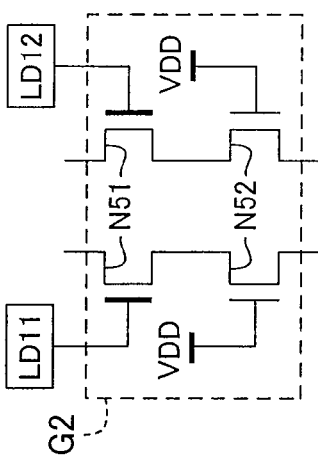
Figure 22A:
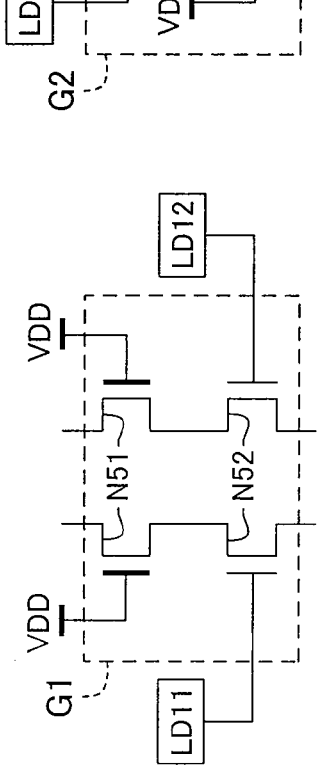
Figure 22E:
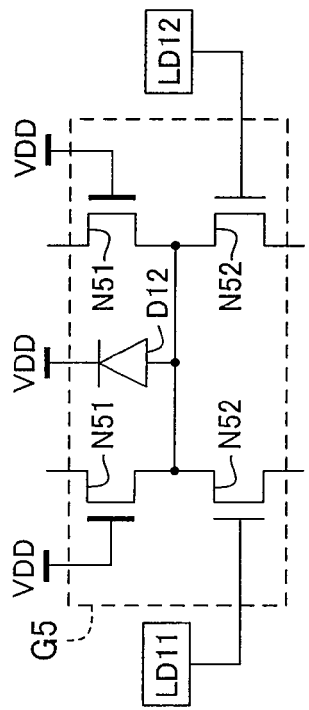
Figure 22D:
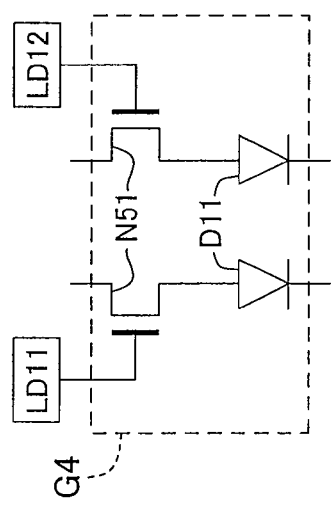
Figure 23:
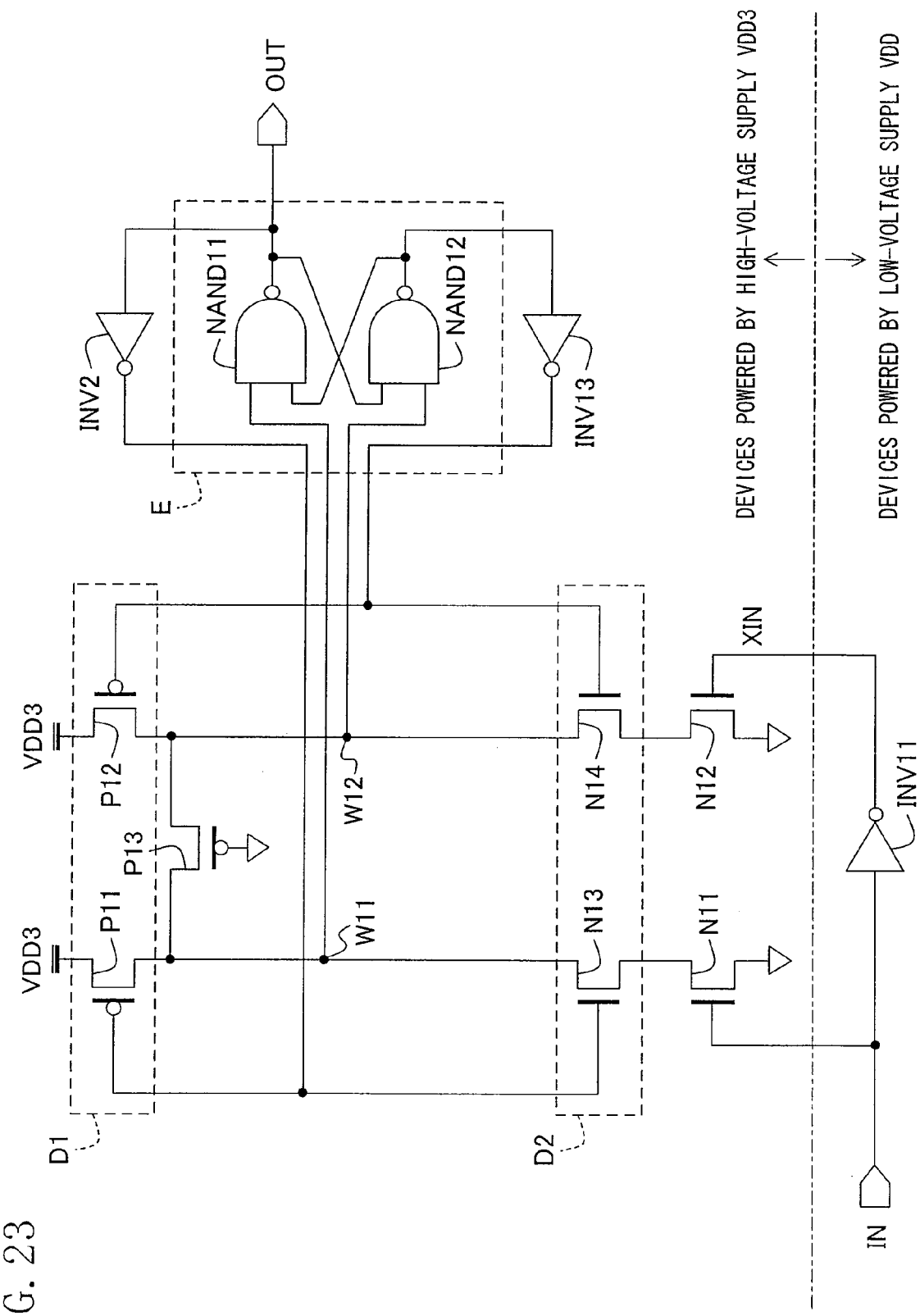
FIG. 23 is a view illustrating the configuration of another conventional level shift circuit.

It should be noted that in the twelfth through fourteenth embodiments, the disconnecting circuit/protection circuit G may be replaced with one of disconnecting circuit/protection circuits G1 through G5 shown in FIGS. 22A through 22E. The disconnecting circuit/protection circuit G5 of FIG. 22E is an exemplary configuration in which a clamp circuit D12 is disposed in the disconnecting circuit/protection circuit G1 of FIG. 22A. Nevertheless, it is obvious that configurations in which the clamp circuit D12 is disposed in the disconnecting circuit/protection circuits G2 through G4 of FIGS. 22B through 22D may be also adopted.

What is claimed is:

1. A level shift circuit comprising: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively;

two N-type high-voltage transistors, each of which includes first and second terminals, which receive at their respective gates the complementary first and second input signals powered by the low-voltage supply, and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively;

a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes; and a protection circuit, which includes first, second, third, and fourth terminals connected to the first, second, third, and fourth nodes, respectively, and restricts voltages at the first and second nodes to not more than the voltage of the low-voltage supply, wherein the protection circuit includes two N-type protection transistors each including first and second terminals, the first terminals of the N-type protection transistors being connected to the first and second nodes, respectively, the second terminals of the N-type protection transistors being connected to the third and fourth nodes, respectively, and wherein the complementary first and second input signals are respectively input via delay circuits to the gates of the two N-type protection transistors in the protection circuit.

2. A level shift circuit comprising: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively;

two N-type high-voltage transistors, each of which includes first and second terminals, which receive at their respective gates the complementary first and second input signals powered by the low-voltage supply, and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively;

a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes; and a protection circuit, which includes first, second, third, and fourth terminals connected to the first, second, third, and fourth nodes, respectively, and restricts voltages at the first and second nodes to not more than the voltage of the low-voltage supply, wherein the protection circuit includes two N-type protection transistors each including first and second terminals, the first terminals of the N-type protection transistors being connected to the first and second nodes, respectively, the second terminals of the N-type protection transistors being connected to the third and fourth nodes, respectively, and wherein the complementary first and second input signals are input directly to the respective gates of the N-type protection transistors in the protection circuit.

3. A level shift circuit comprising: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively;

two N-type high-voltage transistors, each of which includes first and second terminals, which receive at their respective gates a voltage of the low-voltage supply and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively;

a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes; and a protection circuit, which includes first, second, third, and fourth terminals connected to the first, second, third, and fourth nodes, respectively, and restricts voltages at the first and second nodes to not more than the voltage of the low-voltage supply, wherein the protection circuit includes two protection diodes which are respectively connected to the first and second nodes at their respective cathodes and to the third and fourth nodes at their respective anodes.

4. A level shift circuit comprising: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively;

two N-type high-voltage transistors, each of which includes first and second terminals, which receive at their respective gates a voltage of the low-voltage supply and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively;

a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes; and a protection circuit, which includes first, second, third, and fourth terminals connected to the first, second, third, and fourth nodes, respectively, and restricts voltages at the first and second nodes to not more than the voltage of the low-voltage supply, wherein the voltage of the low-voltage supply is supplied to the respective gates of the two N-type high-voltage transistors.

5. The circuit of claim 4, wherein a stop mode signal, which is put to a low potential level when the level shift circuit is to be stopped, is input to the gates of the two N-type high-voltage transistors.

6. The circuit of claim 4, wherein the Complementary first and second input signals are respectively input via delay circuits to the gates of the two N-type high-voltage transistors.

7. The circuit of claim 4, wherein individual threshold voltages of the two N-type high-voltage transistors are set lower than individual threshold voltages of the two N-type signal-receiving low-voltage transistors.

8. The circuit of claim 4, wherein individual threshold voltages of the two N-type high-voltage transistors are set lower than individual threshold voltages of the two N-type signal-receiving low-voltage transistors.

9. The circuit of claim 4, wherein the protection circuit includes two N-type protection transistors each including first and second terminals, the first terminals of the N-type protection transistors being connected to the first and second nodes, respectively, the second terminals of the N-type protection transistors being connected to the third and fourth nodes, respectively.

10. The circuit of claim 9, wherein the voltage of the low-voltage supply is supplied to the gates of the two N-type protection transistors in the protection circuit.

11. The circuit of claim 9, wherein the complementary first and second input signals are respectively input via delay circuits to the gates of the two N-type protection transistors in the protection circuit.

12. The circuit of claim 9, wherein the complementary first and second input signals are input directly to the respective gates of the N-type protection transistors in the protection circuit.

13. The circuit of claim 9, wherein the protection circuit includes two protection diodes which are respectively connected to the first and second nodes at their respective cathodes and to the third and fourth nodes at their respective anodes.

14. A level shift circuit comprising: two N-type signal-receiving low-voltage transistors, which receive at their respective gates complementary first and second input signals powered by a low-voltage supply, and each of which has first and second terminals, the first terminals of the N-type signal-receiving low-voltage transistors being grounded, the second terminals of the N-type signal-receiving low-voltage transistors being connected to first and second nodes, respectively;
two N-type high-voltage transistors, each of which includes first and second terminals, which receive at their respective gates a voltage of the low-voltage supply and which turn on in a complementary manner according to the first and second input signals, the first terminals of the N-type high-voltage transistors being connected to third and fourth nodes, respectively, the second terminals of the N-type high-voltage transistors being connected to fifth and sixth nodes, respectively;
a power supply circuit, which includes a first terminal connected to a high-voltage supply, a second terminal connected to the fifth node, and a third terminal connected to the sixth node, and supplies a voltage of the high-voltage supply to one of the fifth and sixth nodes, while blocking the supply of the voltage of the high-voltage supply to the other of the fifth and sixth nodes;
a protection circuit, which includes first, second, third, and fourth terminals connected to the first, second, third, and fourth nodes, respectively, and restricts voltages at the first and second nodes to not more than the voltage of the low-voltage supply, and
further comprising first and second clamp circuits, which are disposed between the low-voltage supply and the third and fourth nodes, respectively, and which clamp voltages at the third and fourth nodes to the voltage of the low-voltage supply.

\* \* \* \* \*